United States Patent [19]
Allen et al.

[11] Patent Number: 5,331,215
[45] Date of Patent: * Jul. 19, 1994

[54] ELECTRICALLY ADAPTABLE NEURAL NETWORK WITH POST-PROCESSING CIRCUITRY

[75] Inventors: Timothy P. Allen, Los Gatos; Janeen D. W. Anderson, Fremont; Carver A. Mead, Pasadena; Federico Faggin, Los Altos Hills; John C. Platt, Mountain View; Michael F. Wall, Sunnyvale, all of Calif.

[73] Assignee: Synaptics, Incorporated, San Jose, Calif.

[*] Notice: The portion of the term of this patent subsequent to Oct. 22, 2008 has been disclaimed.

[21] Appl. No.: 922,535

[22] Filed: Jul. 30, 1992

Related U.S. Application Data

[63] Continuation-in-part of Ser. No. 913,691, Jul. 14, 1992, abandoned, which is a continuation-in-part of Ser. No. 781,503, Oct. 22, 1991, Pat. No. 5,160,899, which is a continuation of Ser. No. 525,764, May 18, 1990, Pat. No. 5,059,920, which is a continuation-in-part of Ser. No. 486,336, Feb. 28, 1990, Pat. No. 5,068,622, which is a continuation-in-part of Ser. No. 282,176, Dec. 9, 1988, Pat. No. 4,935,702.

[51] Int. Cl.$^5$ .................................. H03K 19/0948
[52] U.S. Cl. .................................. 307/201; 395/24
[58] Field of Search .................... 307/201; 395/24

[56] References Cited

U.S. PATENT DOCUMENTS

| | | | |
|---|---|---|---|
| 4,962,342 | 10/1990 | Mead et al. | 307/201 |
| 5,053,638 | 10/1991 | Furutani et al. | 307/201 |
| 5,059,814 | 10/1991 | Mead et al. | 307/201 |
| 5,059,920 | 10/1991 | Anderson et al. | 330/253 |
| 5,083,044 | 1/1992 | Mead et al. | 307/201 |

Primary Examiner—Edward P. Westin
Assistant Examiner—Benjamin D. Driscoll
Attorney, Agent, or Firm—D'Alessandro, Frazzini & Ritchie

[57] ABSTRACT

A synaptic array according to the present invention comprises a plurality of electrically-adaptable elements. Electrons may be placed onto and removed from a floating node in each electrically adaptable element associated with at least one MOS insulated gate field effect transistor, usually the gate of the transistor, in an analog manner, by application of first and second electrical control signals generated in response to an adapt signal. The inputs to all synaptic elements in a row are connected to a common row input line. Adapt inputs to all synaptic elements in a column are connected together to a common column adapt line. The current supplied to all amplifiers in a column is commonly provided by a sense line. In order to adapt the synaptic elements in the M row by N column matrix of the present invention, the voltages to which a given column n of the matrix is to be adapted are placed onto the input voltage lines, and the synaptic elements in column n are then simultaneously adapted by assertion of an adapt signal on the adapt line for column n. The vectors of input voltages for adapting successive columns may be placed sequentially onto the row input voltage lines and used to adapt the columns of synaptic elements by assertion of the adapt signals on the appropriate column adapt lines until the entire array is electrically adapted. After each synaptic element has been adapted, the current flowing through it will be maximized when the voltage at the input of the synaptic element equals the voltage to which the synaptic element has been adapted. An electrically adaptable winner-take-all circuit has its inputs connected to the column-sense lines of the array.

44 Claims, 15 Drawing Sheets

ELECTRICALLY ADAPTABLE NEURAL NETWORK WITH POST-PROCESSING CIRCUITRY

RELATED APPLICATIONS

This application is a continuation-in-part of co-pending application Ser. No. 07/913,691, filed Jul. 14, 1992, now abandoned, which is a continuation-in-part of co-pending application Ser. No. 07/781,503, filed Oct. 22, 1991, now U.S. Pat. No. 5,160,899, which is a continuation of application Ser. No. 07/525,764, filed May 18, 1990, now U. S. Pat. No. 5,059,920, which is a continuation-in-part of application Ser. No. 07/486,336, filed Feb. 28, 1990, now U.S. Pat. No. 5,068,622, which is a continuation-in-part of application Ser. No. 07/282,176, filed Dec. 9, 1988, now U. S. Pat. No. 4,935,702.

BACKGROUND OF THE INVENTION

1. Field Of The Invention

The present invention relates to artificial neural networks. More particularly, the present invention relates to an array of electrically-adaptable synapses for use in a neural network.

2. The Prior Art

Several schemes for using a matrix of electronic devices for neural network applications have been proposed. To date, all such schemes involve using "weights" to control the amount of current injected into an electrical node "neuron". In most prior art structures, these weights were set by controlling the value of a resistor or the saturation current of a transistor. The limitation of any such scheme is that the value of any parameter of an electronic device in an integrated circuit is not well controlled. For example, the saturation currents of two MOS transistors of the same size can differ by a factor of two if these devices are operated in the sub-threshold regime. The "training" mechanism that adjusts the weights must take these uncertainties into account by iterating and testing the outcome of the weight adjustments process.

U.S. Pat. No. 5,083,044 discloses and claims a synaptic element comprising an adaptive amplifier. The amplifier incorporates a floating gate element and may be adapted by exposing a portion of the floating gate of the adaptive amplifier to a source of ultraviolet light. This synaptic element may be used as a trainable synapse in which the weights may be adjusted to compensate for typical transistor nonuniformities and to otherwise manipulate the weights.

It is desirable to provide an adaptive mechanism which may be adapted by electrical means whereby the amplifier electrically adjusts itself to any uncertainty in device parameters, as part of the training process. Such a synaptic element is disclosed in parent application Ser. No. 07/525,764, filed May 18, 1990, now U.S. Pat. No. 5,059,920. This synaptic element has the advantage that it may be electrically adapted while the circuit is in its normal operating regime. The present application extends the disclosure of the parent application to include an electrically-trainable neural network.

BRIEF DESCRIPTION OF THE INVENTION

A synaptic array according to the present invention comprises an array of electrically adaptable elements. Electrons may be placed onto and removed from a floating node in each electrically adaptable element associated with at least one MOS insulated gate field effect transistor, usually the gate of the transistor, in an analog manner, by application of first and second electrical control signals. A first electrical control signal controls the injection of electrons onto the floating node from an electron injection structure and the second electrical control signal controls the removal of electrons from the floating node by an electron removal structure. In its simplest embodiment, the synaptic element may comprise a CMOS inverter in which the gates of the P-Channel and N-Channel MOS transistors are connected to a floating node and wherein the input node to the inverter is coupled to the floating node by a capacitor. An electrical adaptation circuit is connected between the output and the floating node of the inverter.

According to a first aspect of the present invention, an N by M array of synaptic elements is arranged as one or more rows and columns. Each synaptic element in the synaptic array comprises an adaptable CMOS inverter or other amplifier circuit, as disclosed in application Ser. No. 07/525,764, filed May 18, 1990, now U.S. Pat. No. 5,059,920. This United States Patent is expressly incorporated herein by reference. This patent discloses the use of electrical adaptation to store an analog voltage on a floating node for the purpose of canceling any offsets in analog amplifier circuits. The methods taught therein may be used to store an arbitrary analog voltage on the floating node and can thus be used to store a weight in a synaptic element of a neural network array.

The inputs to all synaptic elements in a row (or, alternatively, a column) are connected to a common row (or column) input line. Adapt inputs to all synaptic elements in a column (or, alternatively, a row) are connected together to a common column (or row) adapt line. The current supplied to all amplifiers in a column is commonly provided by a sense line.

In order to adapt the synaptic elements in the M row by N column matrix of the present invention, the voltages to which a given column n of the matrix is to be adapted are placed onto the input voltage lines, and the synaptic elements in column n are then simultaneously adapted by assertion of an adapt signal on the adapt line for column n in the manner disclosed in U.S. Pat. No. 5,059,920.

The vectors of input voltages for adapting successive columns may be placed sequentially onto the row input voltage lines and used to adapt the columns of synaptic elements by assertion of the adapt signals on the appropriate column adapt lines until the entire array is electrically adapted. After each synaptic element has been adapted, the current flowing through it will be maximized when the voltage at the input of the synaptic element equals the voltage to which the synaptic element has been adapted.

According to a second aspect of the present invention, a readable synapse is disclosed. The stored analog voltage to which the synapse has been adapted can be read out onto an input/output line by applying a read signal to a read line. An array of readable synapses is also provided.

A plurality of readable adaptable synaptic elements are placed in a M by N array. The inputs of all synaptic elements in each row are commonly connected to one of a plurality of row input lines. The adapt inputs of all synaptic elements in each column are commonly connected to one of a plurality of adapt input lines. The current supplied to all synaptic elements in a column is commonly provided by a sense line. The read lines for all synaptic elements in a column are connected to a common column read line and the output of the read circuits of all synaptic elements in a row are commonly connected to a row output line. Alternatively, common row input/output line may be employed and a sample/hold circuit may be connected between the input/output line and the input node of each synaptic element in an array. The output of the read circuit of each synaptic element in a row may then also be connected to the input/output row line.

According to a third aspect of the present invention, a post processing circuit is provided for the synaptic array of the present invention. The post-processing circuit is in the form of a "winner-take-all" circuit, which has a plurality of inputs, a different one of which is connected to a different one of the row output lines of the array. A plurality of outputs of the winner-take-all circuit correspond one-to-one to its inputs, and the output corresponding to the input having the largest signal present is activated. The winner-take-all circuit is electrically adaptable to compensate for circuit and process variations.

BRIEF DESCRIPTION OF THE DRAWINGS

FIG. 1b is a plot of output current as a function of input voltage for the electrically adaptable synapse of FIG. 1a.

FIGS. 2b-2f are several structural implementations of the device of FIG. 2a.

FIG. 7b is a simplified and generalized schematic diagram of the electrically-alterable synaptic element of FIG. 7a.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
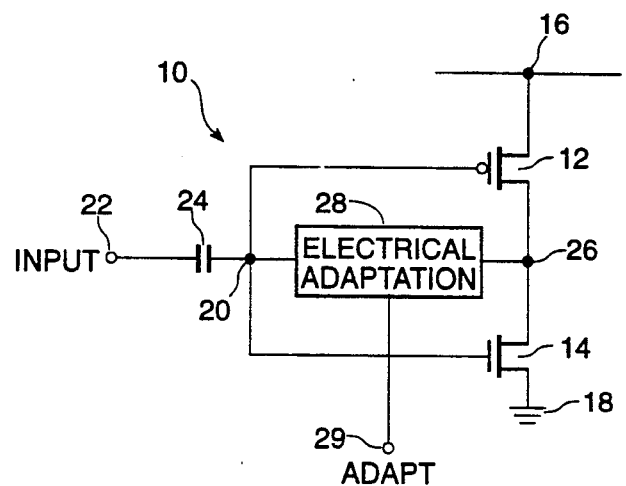
FIG. 1a is a schematic diagram of an electrically adaptable synapse according to the present invention.

Referring first to FIG. 1a, a schematic diagram of a first embodiment of a synaptic element circuit structure is shown which is useful for performing the long term analog learning function. Synaptic element 10 comprises a CMOS inverter including P-Channel MOS transistor 12 and N-Channel MOS transistor 14 connected in series between a current sense node 16 and a power supply rail 18 shown as ground. The input floating node 20 of the inverter, comprising the gates of MOS transistors 12 and 14, is a floating node and is coupled to the circuit input node 22 via capacitor 24. The output node 26 of the inverter comprises the common connection of the drains of MOS transistors 12 and 14.

The source of P-Channel MOS transistor 12 forms a sense node 16 for the synaptic element of FIG. 1a. Those of ordinary skill in the art will readily observe that the source of N-Channel MOS transistor 14 could form the sense node 16 of the synaptic element of FIG. 1a. In this case, the source of P-Channel MOS transistor 12 would be connected to a voltage rail such as $V_{DD}$. Such a circuit would be equivalent to the circuit of FIG. 1a.

An electrical adaptation circuit, shown in block form at reference numeral 28, is connected between the output node 26 and the floating node 20. Presently preferred structures for performing the electrical adaptation (learning) function are disclosed and claimed in U.S. Pat. No. 4,953,928, which is expressly incorporated herein by reference. These structures include both means for injecting electrons onto floating node 20 and means for extracting electrons from floating node 20. The operation of electrical adaptation circuit 28 is controlled by an adapt node 29, as will be disclosed herein.

Those of ordinary skill in the art will recognize from the disclosure herein that, in its simplest form, synaptic element 10 may comprise a single MOS transistor with its gate comprising a portion of floating node 20. As disclosed herein, synaptic element 10 may comprise a variety of different amplifying elements, each useful for performing different functions. For example, the circuit disclosed in FIG. 5 of U.S. Pat. No. 5,099,156 may be used as a synaptic element in the arrays disclosed herein, with the understanding that the drain nodes of all like legs of synapses in a single column are each commonly connected to corresponding sense amplifier loads. Those of ordinary skill in the art will be able to select appropriate amplifying elements to use as synaptic elements in accordance with the particular application to be addressed in light of the teachings herein.

It is presently preferred to inject electrons onto floating node 20 using a non-avalanche hot electron injection semiconductor device. Suitable semiconductor devices for performing non-avalanche hot electron injection are depicted in FIGS. 2a-2f.

Figure 1B:
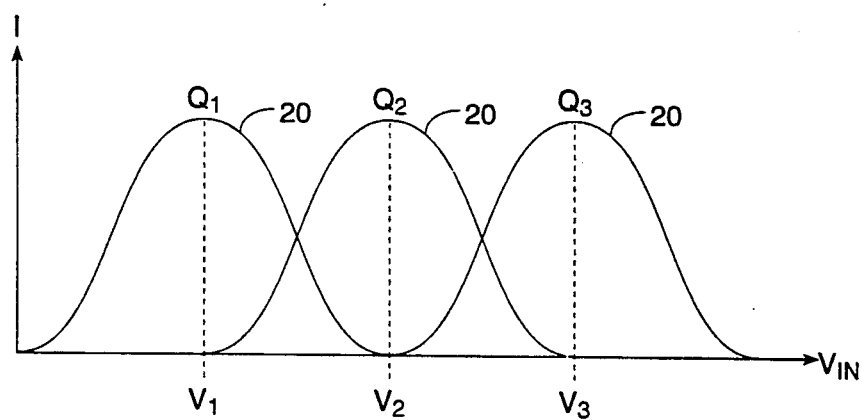

Referring now to FIG. 1b, the three curves (leftmost, center, and right-most) show the current drawn by the synaptic element 10 of FIG. 1a as a function of input voltage for three cases in which the circuit has been adapted to different voltages $V_1$, $V_2$, and $V_3$, respectively. Each curve corresponds to a different charge ($Q_1$, $Q_2$, $Q_3$, respectively) stored on the floating node 20. A characteristic of the CMOS inverting amplifier of FIG. 1a is that when the input voltage is equal to the voltage to which the circuit has been adapted, the output current is maximized as shown in the three curves of FIG. 1b.

Figure 2A:
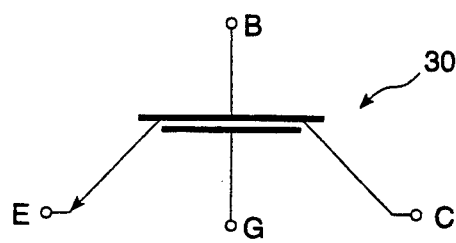
FIG. 2a is a generic schematic symbol for a non-avalanche hot electron injection device.

Referring first to FIG. 2a, a generic schematic symbol for such a non-avalanche hot electron injection device is shown at reference numeral 30 as an NPN bipolar transistor having an insulated gate member in addition to its base, emitter, and collector regions. In the structural implementations which follow as FIGS. 2b-2f, this NPN transistor is shown as both a lateral device and a vertical device. As an aid to interpretation of the following figures, like structures are given like reference numerals.

Figure 2B:
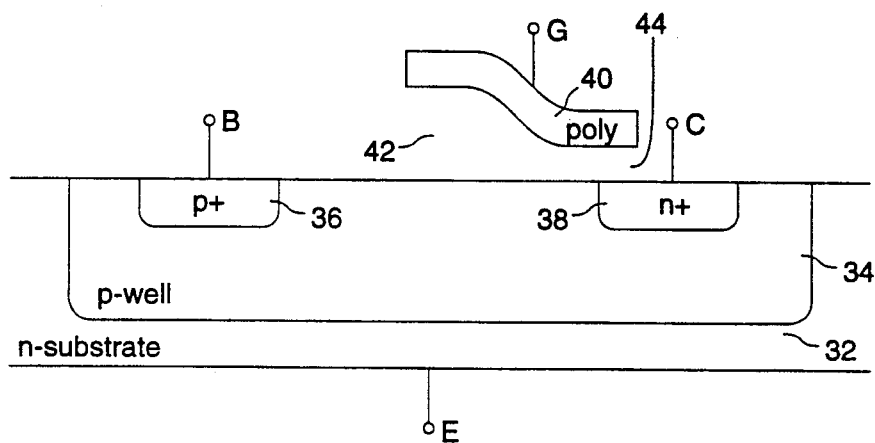

Referring to FIG. 2b, a first embodiment of the device of FIG. 2a may be fabricated on a semiconductor substrate 32 of n-type conductivity, which serves as the device emitter. A well region 34 of a p-type conductivity, serving as the base of the device, is formed in substrate 32. A p-type contact doped region 36 serves as the base contact. A doped region 38 having an n-type conductivity serves as the collector of the device.

A polysilicon floating gate 40 (which forms floating node 20 of the amplifiers disclosed herein) is formed above the surface of the well structure 34 and is separated from the surface of the well by an insulating layer 42. A portion of floating gate 40, lying at least partially above doped region 38, is separated from the surface of the well by an insulating layer 44, having a thickness less than the thickness of insulating layer 42.

Figure 2C:
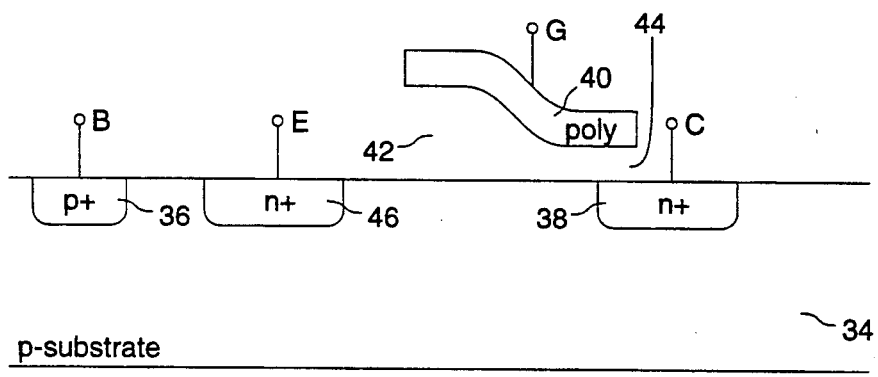

In an alternative embodiment shown in FIG. 2c, the well region may be eliminated if a p-type substrate region 34 is used which, like the well region 34 of FIG. 2b, serves as the base of the device, with doped region 36 used as the base contact. N-type doped region 38 serves as the collector of the device. In this embodiment, another n-type doped region 46 in substrate 34 serves as the emitter of the device.

Figure 2D:
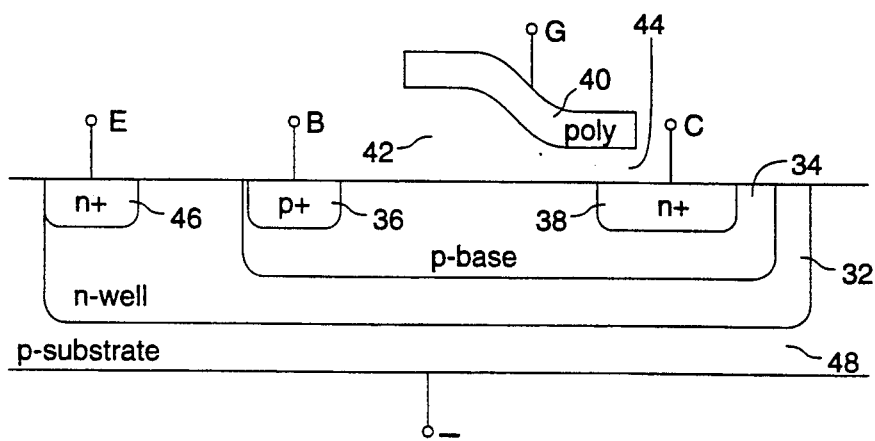

The embodiment shown in FIG. 2d is much like the embodiment of FIG. 2b except that region 32, the substrate in FIG. 2b, is a n-well region in a p-type substrate 48 and an n-type doped region 46 in n-well region 32 serves as the emitter contact of the device.

Figure 2E:
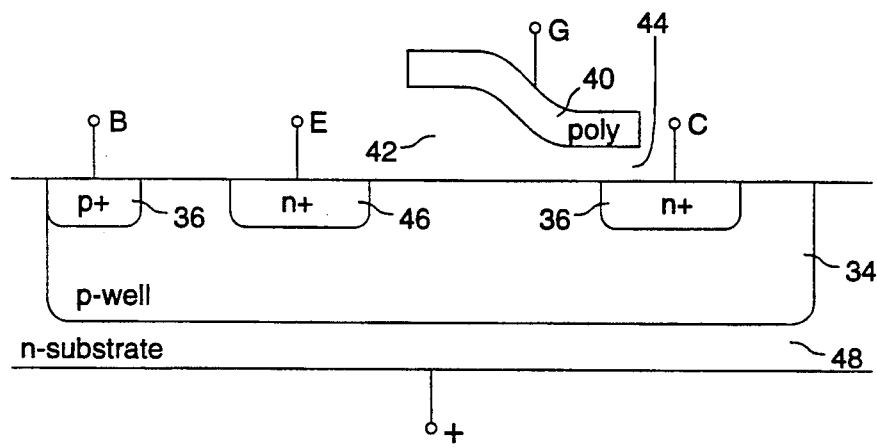

The embodiment of FIG. 2e is similar to the embodiment of FIG. 2b but the emitter of the device is an n-type doped region 46 in the p-well region 34 instead of the substrate 32 in FIG. 2b.

Figure 2F:
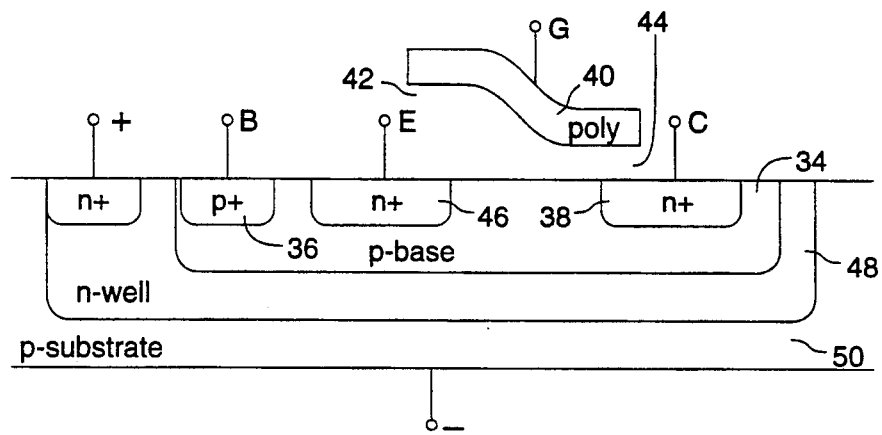

The embodiment of FIG. 2f is like the embodiment of FIG. 2e but the substrate 48 of FIG. 2e is an n-well 48 in a p-type substrate 50 in FIG. 2f.

Typically, the well regions in the structures shown in FIGS. 2b-2f may be on the order of 3 microns in depth, doped to concentrations in the area of about $1 \times 10^{16}$ atoms/cm$^3$. The substrate regions may be doped to concentrations on the order of about $5 \times 10^{15}$ atoms/cm$^3$. The diffusion regions in the wells and substrates may be on the order of about 0.3 microns in depth, doped to a concentration of about $1 \times 10^{20}$ atoms/cm$^3$. The base regions in FIGS. 2d and 2f may be about 0.5 microns in depth, doped to a concentration of about $1 \times 10^{17}$ atoms/cm$^3$. The preferred dopant species is boron, although those of ordinary skill in the art will understand that other species may be used. Those of ordinary skill in the art will recognize that, as time advances, the dimensions used in a typical CMOS process will become smaller, and the doping densities, etc., will scale accordingly.

In the presently preferred embodiments of FIGS. 2b-2f, the gate oxide thicknesses should be about 400 angstroms and polysilicon gate layer thicknesses should be about 4,000 angstroms, and the polysilicon gates should be doped to a level of about $1 \times 10^{21}$ atoms/cm$^3$. The capacitive coupling of the polysilicon gate to the collector of these devices should be about 20 femtofarads.

Figure 2G:
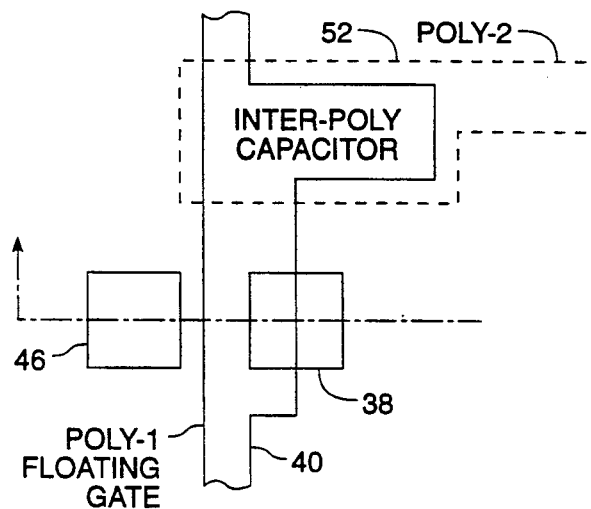
FIG. 2g is a top view of the central portions of structures of FIGS. 2b-2f, showing the positioning of a second polysilicon layer.

FIG. 2g is a top view of the central portions of structures of FIGS. 2b-2f, showing the positioning of a second polysilicon layer. A region of second layer polysilicon 52 overlies a large portion of floating gate 40, is separated therefrom by a layer of interpoly oxide, and is thus capacitively coupled thereto. The second polysilicon layer 52 may be formed as a standard second electrode from second level polysilicon using conventional CMOS processing techniques. The second layer polysilicon region 52 is used to hold polysilicon floating gate 40 at a desired potential through capacitive coupling.

Figure 2H:
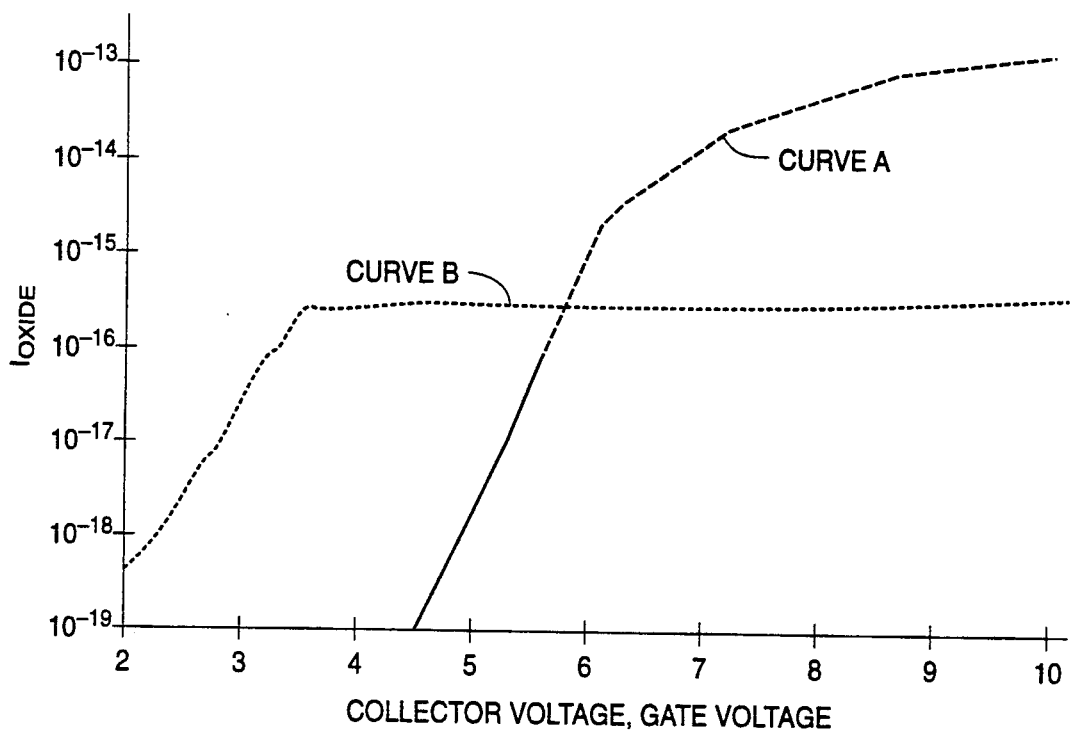
FIG. 2h is a graph in which curve A is a graph of current injected on to the floating node as a function of the voltage on the floating node and curve B is a graph of current injected on to the floating node as a function of collector voltage of the hot electron injection device measured with respect to its base at a device current level of 500 nanoamperes.

Curve A of FIG. 2h is a graph of current injected on to floating node 20 as a function of the voltage on floating node 20. It can be seen that the rate of hot electron injection becomes exponentially small as the floating gate voltage decreases. The field in the oxide should preferably be in the direction to encourage electrons to flow from substrate to floating gate, meaning that the voltage on the floating gate should preferably be more positive than the collector. Curve B is a graph of current injected on to floating node 20 as a function of collector voltage of hot electron injection device 30 measured with respect to its base. These curves were taken with a collector current of approximately 500 nanoamperes. It can be seen that the rate of hot electron injection becomes very low for collector voltages below about 2 volts. The rate of electron injection was found to be proportional to the collector current over several orders of magnitude below this current level. Thus, either the collector current or the collector voltage, or both, may be used as electrical inputs whereby the electron injection rate on to floating node 20 may be controlled over many orders of magnitude without significantly affecting the voltage on the floating node 20, provided that the capacitive coupling between the floating node 20 and the collector is significantly smaller than the capacitance of capacitor 24. The ratio of these capacitances is preferably greater than about 10:1 to avoid changing the voltage on the floating node when the voltage on the collector is lowered to terminate injection.

In a presently preferred embodiment of the invention, the means for removing electrons from the floating node 20 of the amplifiers disclosed herein is an interpoly tunneling device. Referring to FIG. 3a a generic schematic symbol 60 for such a device is shown.

Figure 3C:
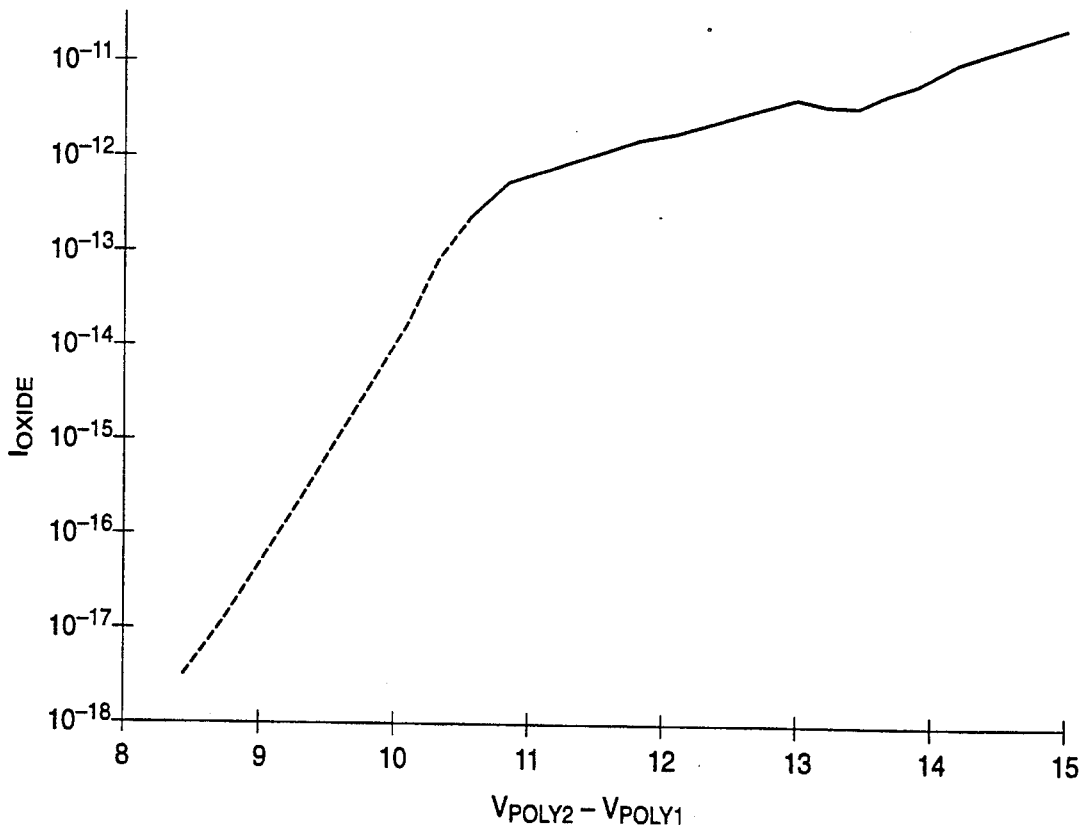
FIG. 3c is a graph of interpoly tunneling current versus interpoly voltage for the tunneling device of FIGS. 3a and 3b.
Figure 3A:
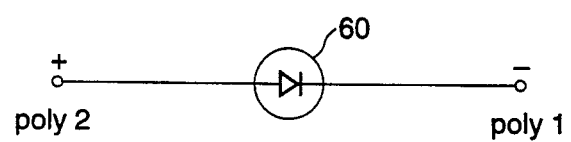
FIG. 3a is a generic schematic symbol for an interpoly tunneling device.
Figure 3B:
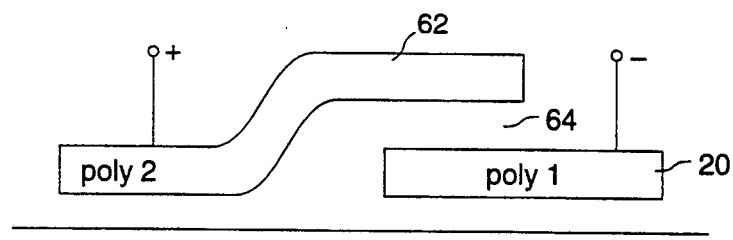
FIG. 3b is a cross sectional view of a presently preferred interpoly tunneling device.

Referring to FIG. 3b, this interpoly tunneling device is shown to preferably include a second layer of polysilicon 62, which may have a thickness of about 4,000 angstroms and an arsenic or phosphorus doping concentration of about $1 \times 10^{21}$, disposed above a selected portion of floating node 20 and separated therefrom by an insulating layer 64 having a thickness on the order of about 500 angstroms. The capacitance between second polysilicon layer 62 and floating node 20 should preferably be kept as small as allowed by the design rules of the fabrication process.

By varying the voltage on second layer of polysilicon 62, the rate of electron removal from floating node 20 can be controlled from zero (no tunneling) at zero volts, to $10^{-12}$ amperes at 11 volts, these voltages being measured relative to floating node 20. Thus the voltage on second layer polysilicon 62 may be used as an electrical input whereby the rate of electron removal from floating node 20 may be controlled over many orders of magnitude without significantly affecting the voltage on floating node 20, provided that the capacitive coupling between the floating node 20 and the second polysilicon layer 62 is significantly smaller than the capacitance of capacitor 24. The ratio of these capacitances is preferably greater than 10:1 to avoid changing the voltage on the floating node when the voltage on node 62 is lowered to terminate tunneling.

Referring now to FIG. 3c, a graph showing interpoly tunneling current as a function of interpoly voltage actually measured in a device fabricated according to the present invention, it can be seen that the tunneling rate can be controlled over orders of magnitude. For voltages less than 8 volts, the rates were so small that measurements would have taken many hours, however it has been established that the exponential dependence of the tunneling current as a function of interpoly voltage continues to exponentially smaller values of the current. Therefore, by applying interpoly voltages of less than 2 volts, it is possible to effectively disable the tunneling process and therefore leave the injected charge on the floating node 20 stable over a period of many years.

If it is assumed that electrical adaptation circuit 28 includes a tunneling device 60 connected between output node 26 and controlled by control circuitry and floating node 20 and a hot electron injection device 30, connected to output node 26 and to one or more voltage sources and controlled by the voltage on output node 26 as taught herein, it can be seen that the operation of the circuit of FIG. 1a depends on the state of the active low adapt node 29 and the voltage on floating node 20. If adapt node 29 is high, the learning function is disabled and the amplifier operates with its crossover point determined by whatever charge is stored on floating node 20.

If, however, node 29 is low, electrons will be caused to enter or leave floating node 20, depending on the state of the voltage on that node. If the voltage on floating node 20, reflected by the input voltage $V_{in}$, is connected to high, the voltage at the first end of the tunneling device 60 will drop to a value below the voltage at which tunneling will take place. In addition, hot electron injection device 30 will cause hot electrons to be injected onto floating node 20. If the voltage on floating node 20, reflected by the input voltage $V_{in}$, is low, hot electron injection device 30 will be turned off.

The auto-compensating amplifier synaptic elements of the present invention are thus characterized by the ability to accomplish two-way continuous learning of an analog value onto the floating node. As used herein, "two-way continuous" learning, is the ability to both inject and remove electrons from floating node 20 in a continuous manner while the amplifier continues to operate normally, and the device is performing its in-circuit function and the voltage on the floating node is within the normal operating range of the device.

Figure 4A:
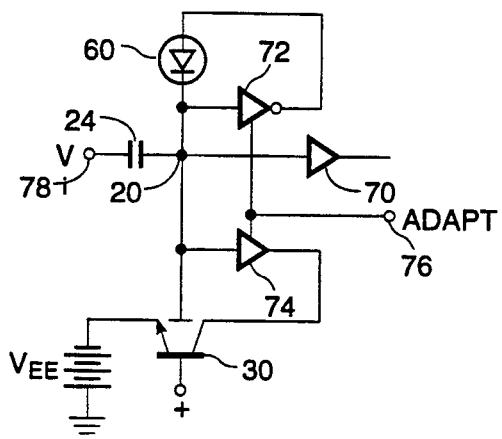
FIGS. 4a-4f are schematic diagrams of several alternative circuits for auto-compensating amplifiers useful in synaptic arrays according to the present invention.
Figure 4B:
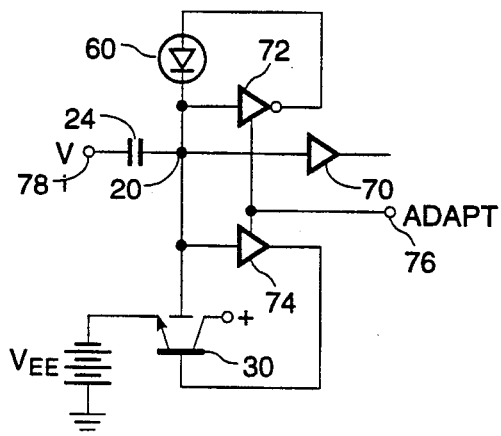
Figure 4C:
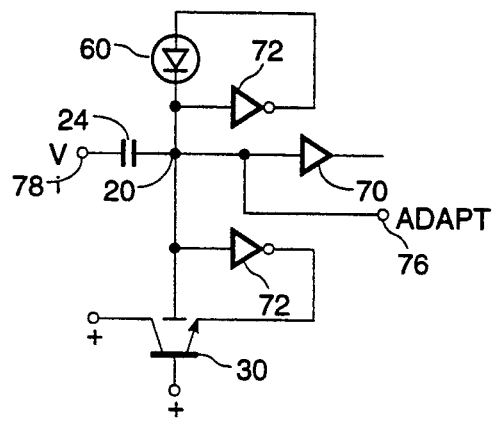

Several alternative circuits for auto-compensating amplifiers according to the present invention are shown in FIGS. 4a–4c. Referring first to FIG. 4a, an amplifier 70 has its input connected to floating node 20. Also connected to floating node 20 are the inputs of enabled inverting amplifier 72 and enabled non-inverting amplifier 74. The enable inputs of amplifiers 72 and 74 are connected to an adapt input 76. The circuit input node 78 is capacitively coupled to floating node 20 via capacitor 24.

The output of enabled inverting amplifier 72 is connected to the poly 2 end of interpoly tunneling device 60. The other end of interpoly tunneling device 60 is floating node 20. The output of enabled non-inverting amplifier 74 is connected to the collector of hot electron injection device 30. The emitter of hot electron injection device 30 is connected to a voltage $V_{EE}$ as shown in FIG. 4a by the battery symbol, its base is connected to a source of positive voltage, and its gate is floating node 20.

It should be noted that the capacitance between the collector of non-avalanche hot-electron injection device 30 acts as positive feedback in the circuit, and can introduce hysteresis that will limit the accuracy with which the auto-compensation can be accomplished. For this reason, it is desirable under most circumstances to limit the effective gain around the loop from floating node 20, through amplifier 74, through the capacitance $C_c$ between the collector of hot-electron injection device 30 and floating node 20. The magnitude of this loop gain is approximately the amplifier gain A multiplied by the ratio of $C_c$ to the total capacitance $C_{TOT}$ of node 20 to all other nodes, including the input. If this loop gain is less than one, then the absence of hysteresic behavior is assured, which allows the floating node to operate in the normal operating range of amplifier 74 during adaptation.

When adapt input 76 is disabled, amplifiers 72 and 74 are disabled and amplifier 70 operates to amplify the voltage present at input node 78. When adapt input 76 is enabled, amplifiers 72 and 74 are enabled and the voltage on floating node 20 is adapted to the voltage required to store the synaptic weight. During adaptation, amplifier 70 continues to perform its amplifying function, i.e., it does not have to be placed in a special non-functioning state to be adapted. If the floating node voltage as coupled by input voltage $V_{in}$ is low such that the output voltage of inverting enabled amplifier 72 is high, the tunneling device 60 is enabled and increases the voltage on the floating node 20. If the floating node voltage as coupled by input voltage $V_{in}$ is high such that the output voltage of non-inverting enabled amplifier 74 is high, the hot electron injection device 70 is enabled and decreases the voltage on the floating node 20.

The embodiments of FIGS. 4b and 4c are similar to the embodiment of FIG. 4a and differ in the manner in which the hot electron injection device 30 is connected to the circuit. Whereas in FIG. 4a adaptation by the hot electron injection device is controlled by collector voltage, in FIGS. 4b and 4c adaptation is controlled by collector current. In FIG. 4b, the output of non-inverting enabled amplifier 74 is connected to the base of hot electron injection device 30 and the collector of hot electron injection device 30 is connected to a source of positive voltage. In FIG. 4c, the output of a second inverting enabled amplifier 72 is connected to the emitter of hot electron injection device 30 and the collector and base of hot electron injection device 30 are both connected to sources of positive voltage. Varying these voltages will affect the injection rate. Those of ordinary skill in the art will readily appreciate that amplifier 70 can be used to perform the functions of either amplifier 72 or 74, or, if provided with both inverting and non-inverting outputs, of both amplifiers 72 and 74, which are shown separately for clarity.

Figure 4D:
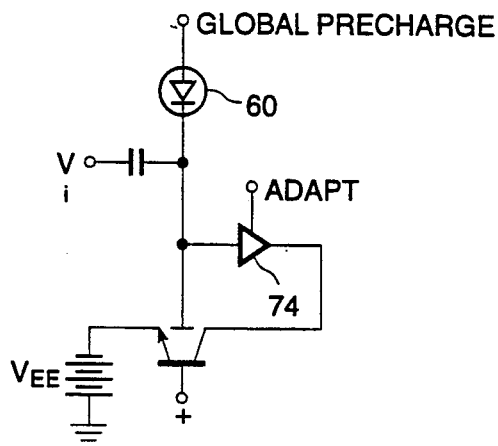
Figure 4E:
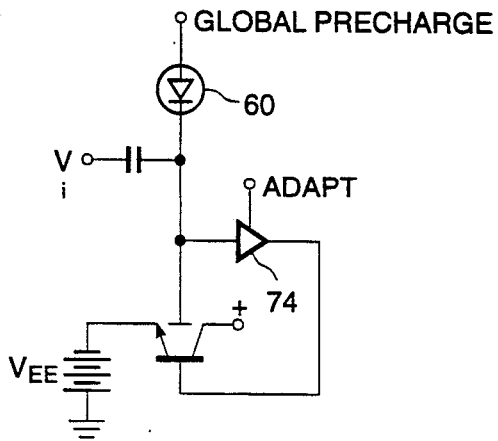
Figure 4F:
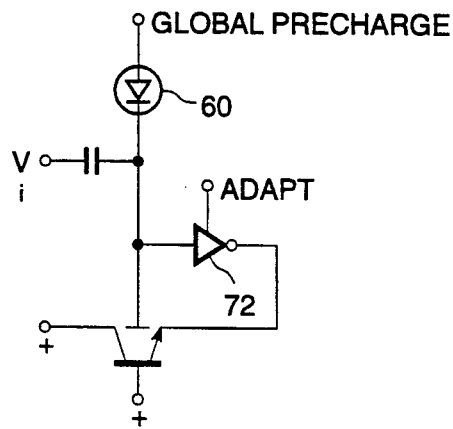

As an alternative to the arrangement of FIGS. 4a-4c, amplifier 72 may be eliminated and the first end of tunneling device 60 may be connected to a node which can be used as a precharge node by the application of a positive voltage, as shown in FIGS. 4d-4f.

Many amplifiers on a single integrated circuit can be precharged by raising the precharge input to a voltage at which tunneling takes place. After some time, the offset voltages of all amplifiers will be of the same sign, and the precharge input voltage can be reduced to a value at which the tunneling current is negligible. The hot-electron injection devices in each individual amplifier can then adapt each amplifier until its individual offset is compensated by the hot-electron injection structure associated with that amplifier. After compensation has taken place, hot-electron injection is reduced to a negligible level by the negative feedback control of hot electron injection through amplifier 74, and second inverting amplifier 70 exactly as is the case of FIGS. 4a-4c.

Figure 5:
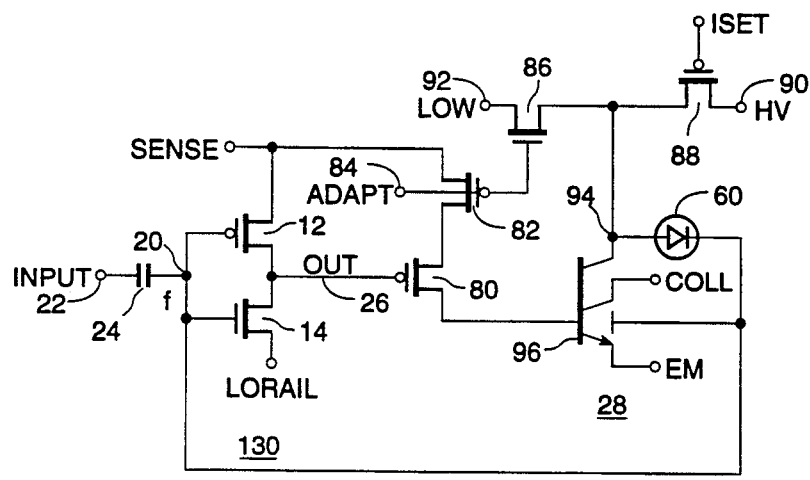
FIG. 5 is a schematic diagram of an embodiment of the present invention according to FIG. 4b.
Figure 6A:
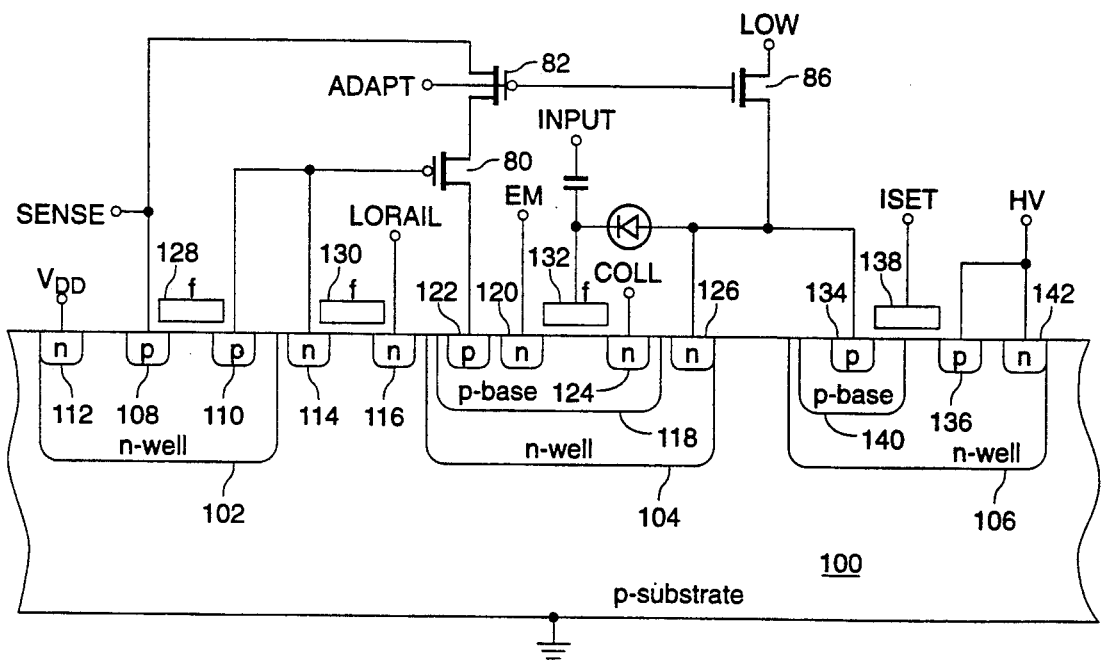
FIGS. 6a and 6b are, respectively, cross-sectional and top views of a silicon implementation of the circuit of FIG. 5.
Figure 6B:
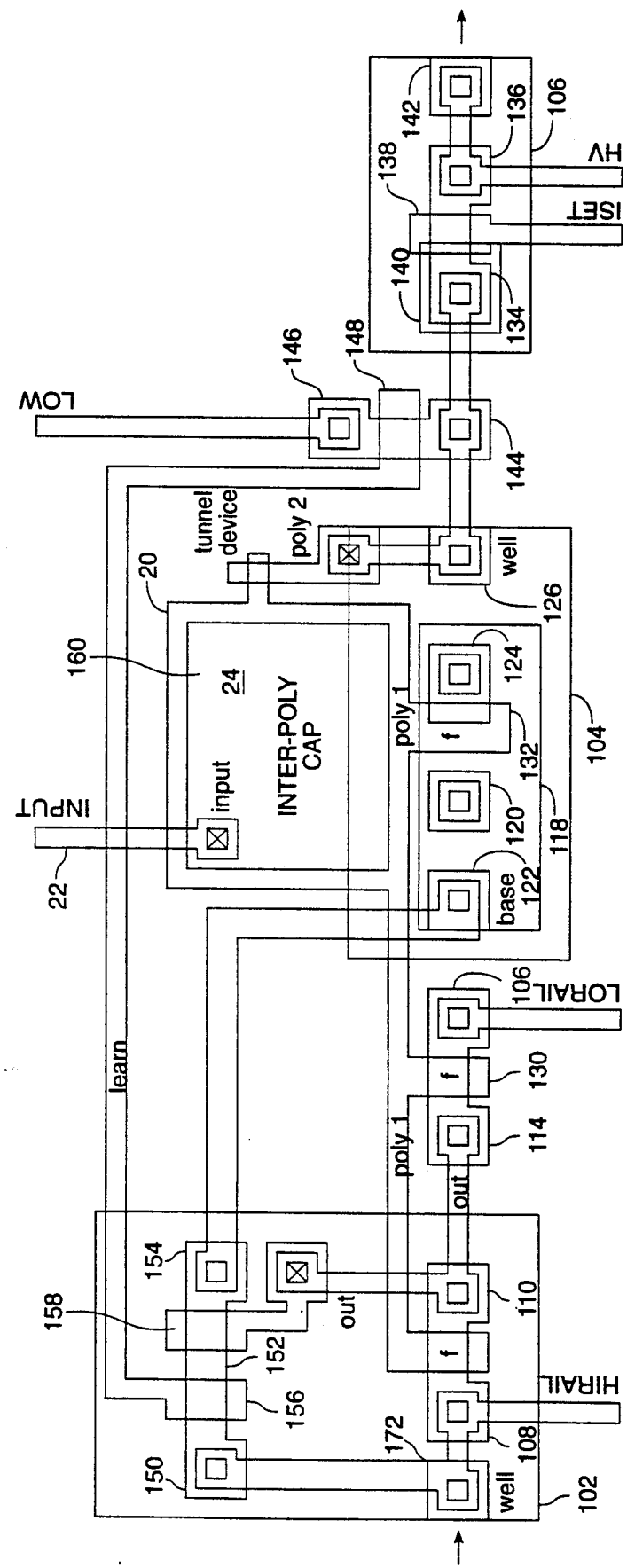

Referring now to FIGS. 5 and 6a-6b, a schematic diagram of a presently preferred embodiment of the circuit of FIG. 4b is shown, using the simple inverter of FIG. 1a as the amplifier element 70. As previously stated, those of ordinary skill in the art will readily understand that other amplifier circuits may be used in place of the simple inverter. The inverter comprises P-Channel MOS transistor 12 in series with N-Channel MOS transistor 14. The gates of transistors 12 and 14 comprise a floating node 20, which is coupled to the amplifier input node 22 through capacitor 24. The output node 26 of the synaptic element 10 is the common connection of the drains of MOS transistors 12 and 14. The source of P-Channel MOS transistor 12 forms a sense node for the synaptic element of FIG. 5. Electrical adaptation circuit 28 is connected between the output node 26 and the floating node 20.

Output node 26 is connected to the gate of P-channel MOS transistor 80. The source of P-Channel MOS transistor 80 is connected to the drain of P-Channel MOS transistor 82, whose source is connected to the positive voltage rail and whose gate is connected to a low-active adapt signal node 84. Low active adapt signal node 84 is also connected to the gate of an N-Channel MOS transistor 86. N-channel MOS transistor 86 is connected in series with P-Channel MOS transistor 88 between a source of high positive voltage 90 and a source of low voltage 92. The first end of tunneling device 60 at node 94 is connected to the common connection of the drains of transistors 86 and 88, and the other end is floating node 20. Source of high positive voltage 90 should be at a voltage high enough to cause tunneling to take place in tunneling device 60, and source of low voltage 92 may be ground or any voltage at which tunneling in tunneling device 60 may take place at an acceptably slow rate. The gate of P-channel MOS transistor 88 is connected to a voltage node $I_{set}$ which will cause a trickle current, e.g., less than about 0.5 microamperes, to flow through P-channel MOS transistor 88.

The drain of P-Channel MOS transistor 80 is connected to the base of hot electron injection device 96, which, in this embodiment includes a double collector NPN bipolar transistor with an insulated MOS polysilicon gate which is electrically connected to floating node 20. One of the collectors of hot electron injection device 96 is connected to the common connection of the drains of transistors 86 and 88. Its other collector is used as an enable input and its emitter is connected to a source of bias voltage.

FIGS. 6a and 6b are, respectively, a cross sectional view and a top view of a presently preferred layout for the circuit depicted in FIG. 5. Referring first to FIG. 6a, the circuit of FIG. 5 may be fabricated on p-type substrate 100 in which n-wells 102, 104, and 106 are conventionally formed. P-channel MOS transistor 12 is formed in n-well 102, and has doped p-type regions 108 and 110, which act as its source and drain respectively. N-type doped region 112, the contact to the n-well 102, is connected to a source of positive voltage, which may be $V_{DD}$ or a higher voltage to produce a body effect in P-channel MOS transistor 12 to alter the shape of its current output characteristic as is known in the art.

N-type doped regions 114 and 116 form the drain and source, respectively, of N-channel transistor 14. Hot electron injection device 96 is formed inside n-well 104, which serves as the first collector of the device. P-type base region 118 contains n-type region 120, serving as the emitter of the device, p-type region 122, serving as the base contact of the device, and n-type region 124, serving as the second collector of the device. N-type region 126 serves as the contact for the first collector.

The gates of transistors 12, 14, shown at reference numerals 128 and 130, and the gate of hot electron injection device 96, shown at reference numeral 132 are fabricated from the layer of polysilicon which comprises floating node 20.

P-channel MOS transistor 88 is constructed in n-well 106, in which p-type doped regions 134 and 136, respectively, serve as its drain and source, and polysilicon region 138 serves as its gate. P-type region 134 is placed inside lightly doped drain p-region 140. N-type region 142 is used to connect the source of high voltage to the source of MOS transistor 88.

Referring now to FIG. 6b, a top view of the structure of the semiconductor cross section of FIG. 6a, n-type regions 144 and 146 serve as the drain and source, respectively, of N-channel MOS transistor 86, and polysilicon region 148 serves as its gate. P-type regions 150 and 152 serve as the source and drain of P-channel MOS transistor 82, p-type regions 152 and 154 serve as the source and drain of P-channel MOS transistor 80, and polysilicon regions 156 and 158, respectively, serve as their gates.

Input node 22 is connected to polysilicon layer 160 which serves as the input plate of capacitor 24. Floating node 20 forms the other plate of capacitor 24.

The operation of the circuit of FIG. 5 depends on the state of the active low adapt input node 84 and the voltage on floating node 20. If adapt node 84 is high, P-channel MOS transistors 80 and 82 are turned off, and N-channel MOS transistor 86 is turned on, thus disabling the learning function, and the inverter comprising transistors 12 and 14 operates with its crossover point determined by whatever voltage is on floating node 20.

If, however, node 84 is low, electrons will be caused to enter or leave floating node 20, depending on the state of the voltage on that node. If the voltage on floating node 20, reflecting the input voltage $V_{in}$, is high, such that the inverter output node 26 is low, P-channel MOS transistors 80 and 82 will both be turned on, causing base current to flow in hot electron injection device 96. The collector current through hot electron injection device 96 will drop the voltage at node 94, the first end of the tunneling device 60 to a value below the voltage at which appreciable tunneling will take place. In addition, hot electron injection device 96 will cause hot electrons to be injected onto floating node 20. If the voltage on floating node 20, reflected by the input voltage $V_{in}$, is low, such that the inverter amplifier output is high, P-channel MOS transistors 80 and 82 will both be turned off, turning off hot electron injection device 96. The voltage at node 94, the first end of the tunneling device 60 will be established at a value above the voltage at which tunneling will take place, causing electrons to leave floating node 20.

Because the voltage on tunneling node 94 ranges from highly positive (10 volts) to near zero relative to floating node voltage, the reverse bias voltages encountered by the drains of MOS transistors 86 and 88 are generally beyond those at which a simple MOS transistor can operate. For this reason, these transistors should be constructed in such a manner that they can be operated with high drain voltages without adverse consequences. The exact techniques employed to construct high voltage MOS transistors will depend on the details of the process employed, and are well known to those of ordinary skill in the art. In most processes, the breakdown voltage of the other collector 104 of the hot electron injection device will be much higher than required.

In FIGS. 6a and 6b, the high voltage capability is achieved in transistor 88 by using a lightly doped drain region 140, which may be formed during the p-base diffusion step as is well known in the art. A similar technique is used with transistor 86, by forming a lightly doped drain during the n-well diffusion step.

Figure 7A:
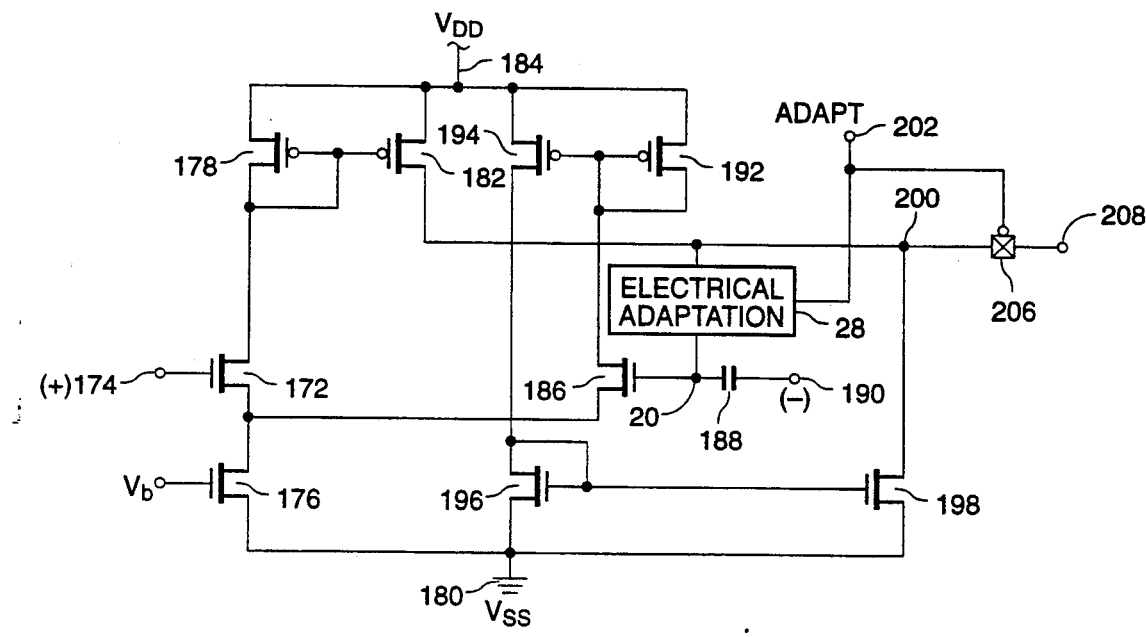
FIG. 7a is a schematic diagram of an alternate embodiment of an electrically-alterable synaptic element according to the present invention.

Referring now to FIG. 7a, a schematic diagram of an alternate embodiment of a synapse for use in the array of the present invention is shown. In the embodiment of FIG. 7a; a transconductance amplifier is utilized. A first N-channel MOS input transistor 172 has its gate connected to a non-inverting input node 174, its source connected to the drain of an N-channel MOS bias transistor 176, and its drain connected to the drain and gate of a first P-channel MOS current mirror transistor 178. The source of N-channel MOS bias transistor 176 is connected to a source of fixed negative voltage $V_{SS}$, shown as ground at reference numeral 180 in FIG. 7a, and its gate is connected to a source of bias voltage $V_b$.

The drain and gate of first P-channel MOS current mirror transistor 178 is also connected to the gate of second P-channel current mirror transistor 182. The sources of first and second P-channel MOS current mirror transistors 178 and 182 are connected to a source of fixed positive voltage 184, shown as $V_{DD}$ in FIG. 7a.

A second N-channel MOS input transistor 186 has its gate connected to a floating node 20. A first capacitor 188 has as its first electrode floating node 20 and as its second electrode an inverting input node 190. The source of second N-channel MOS input transistor 186 is connected to the drain of N-channel MOS bias transistor 176, and the drain of second N-channel MOS input transistor 186 is connected to the gate and drain of a third P-channel MOS current mirror transistor 192. The source of third P-channel MOS current mirror transistor 192 is connected to voltage source 184. A fourth P-channel MOS current mirror transistor 194 has its source connected to voltage source 184, its gate connected to the gate of third P-channel MOS current mirror transistor 192, and its drain connected to the gate and drain of first N-channel MOS current mirror transistor 196. The source of first N-channel MOS current mirror transistor 196 is connected to voltage source 180. A second N-channel MOS current mirror transistor 198 has its gate connected to the gate of first N-channel MOS current mirror transistor 196. The drain of second N-channel MOS current mirror transistor 198 is connected to an output node 200 and to the drain of second P-channel MOS current mirror transistor 182.

Floating node 20 is preferably formed from a first polysilicon layer in a double polysilicon layer process and may be referred to as a floating gate. The electrodes of capacitor 188 are formed from floating gate 20 and from a second layer of polysilicon.

Electrical adaptation circuitry, shown schematically at reference numeral 28, is connected between floating node 20 and output node 200. Electrical adaptation circuitry 28 has an adapt input 202. The preferred embodiment of electrical adaptation circuitry 28 of the synapse of FIG. 7a is the same as that disclosed for the synapse of FIG. 1a.

Finally, a pass gate 206 is connected between the output node 200 and a sense node 208 for connection to a common (column or row) sense line in an array in which the synaptic element is placed. The pass gate is disabled during assertion of the adapt signal.

Figure 7B:
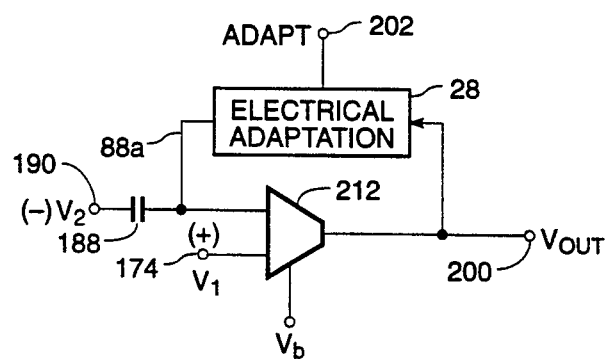

The circuit of FIG. 7a may be schematically represented as shown in FIG. 7b, including amplifier symbol 212, electrical adaptation circuitry 28, capacitor 188, and input nodes 174 and 190.

During normal circuit operation, when the adapt signal 202 is not asserted, the circuit of FIGS. 7a and 7b performs as a classic transconductance amplifier. When used as a synaptic element in a synaptic array, inverting input 190 is usually the input to the synaptic element and the non-inverting input 174 may be connected to a bias voltage, such as ground. Those of ordinary skill in the art will recognize, however, that the non-inverting input 174 may also be used as the input to the synaptic element while biasing the inverting input 190, depending on the application.

A major difference between the circuit of FIGS. 7a and 7b and prior art amplifier circuits is the ability of the circuit of FIGS. 7a and 7b to be adapted in order to store an synaptic weight. When adapt input 202 is asserted, the electrical learning circuitry of the present invention is enabled. Unlike conventional floating gate devices known in the prior art, adaptation of the amplifier structures disclosed herein may take place while the amplifier is performing its normal in-circuit function, while the voltage on floating node 20 is within the normal operating range of the amplifier.

From the two amplifier examples set forth herein, those of ordinary skill in the art will recognize that the present invention is not limited to synapses configured from inverter and transconductance amplifier structures, but rather that the present invention is applicable to amplifiers wherein the gate of at least one transistor comprises a portion of a floating node as taught herein. It is intended that all such amplifier structures are within the scope of the present invention.

Figure 8:
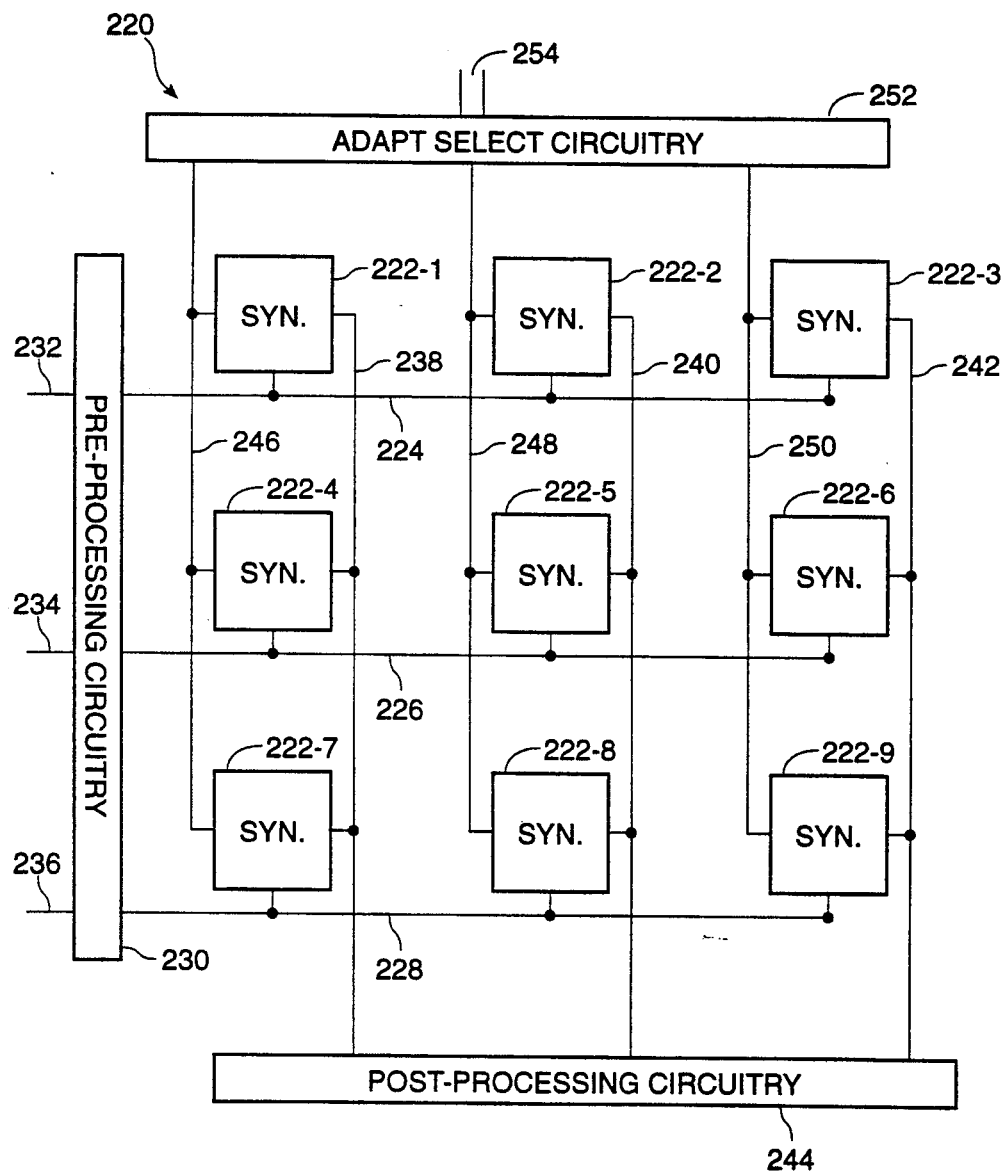
FIG. 8 is a block diagram of a generic array of electrically-alterable synaptic elements according to the present invention.

Referring now to FIG. 8, a generic array structure of electrically-alterable synaptic elements according to the present invention is shown in block diagram form. In FIG. 8 an array of three rows and three columns of synapses is shown, but those of ordinary skill in the art will recognize that arrays of arbitrary size are possible.

A first row of the array 220 contains synaptic elements 222-1 through 222-3; a second row of the array 220 contains synaptic elements 222-4 through 222-6; a third row of the array 220 contains synaptic elements 222-7 through 222-9. The first column of the array 220 contains synaptic elements 222-1, 222-4, and 222-7. The second column of the array 220 contains synaptic elements 222-2, 222-5, and 222-8. The third column of the array 220 contains synaptic elements 222-3, 222-6, and 222-9.

A first row input line 224 is connected to the inputs of the synaptic elements in the first row. A second row input line 226 is connected to the inputs of the synaptic elements in the second row. A third row input line 228 is connected to the inputs of the synaptic elements in the third row. Row input lines 224, 226, and 228 may carry signals driven directly from off chip, or, as shown in FIG. 8, they may carry signals from preprocessing circuitry 230. Preprocessing circuitry 230 may comprise circuitry such as simple buffers, or circuitry for performing more complex functions such as prescaling or normalization. Circuits for performing such functions are well known in the art. Preprocessing circuitry 230 has inputs 232, 234, and 236, which correspond to its outputs 224, 226, and 228. Inputs 232, 234, and 236 may carry signals which originate off chip or from another section of the chip containing the array of the present invention.

A first column sense line 238 is connected to the sense nodes of the synaptic elements in the first column. A second column sense line 240 is connected to the sense nodes of the synaptic elements in the second column. A third column sense line 242 is connected to the sense nodes of the synaptic elements in the third column. If the synaptic elements are configured such that their outputs at the sense nodes are in the form of currents, the currents from the elements in a single column may be summed on a single wire as shown in FIG. 8. Those of ordinary skill in the art will recognize that other more complex arrangements utilizing voltage outputs from the synaptic elements are possible. For example, connecting together the sense node of a column of circuits like that of FIG. 7a will produce a signal that is the weighted average of the individual signals.

Column sense lines 238, 240, and 242 are connected to postprocessing circuitry 244. Postprocessing circuitry 244 may comprise circuitry such as simple current sense amplifiers or circuitry for performing more complex functions such as a "winner-take-all circuit" such as the ones disclosed in the parent cases cited herein.

Finally, the adapt inputs of the synaptic elements in each column of the array are connected to an adapt line associated with that column. Thus, the adapt inputs of synaptic elements 222-1, 222-4, and 222-7 are connected to adapt line 246. The adapt inputs of synaptic elements 222-2, 222-5, and 222-8 are connected to adapt line 248. The adapt inputs of synaptic elements 222-3, 222-6, and 222-9 are connected to adapt line 250. According to a presently preferred embodiment of the invention, adapt lines 246, 248, and 250 may be driven from an adapt decoder 252, which, in the embodiment disclosed in FIG. 8, may be a one-of-three decoder circuit or from a serial shift register. Such circuits are well known in the art. Adapt decoder circuit 252 may be driven from address lines 254 as is known in the art.

During normal circuit operation, the adapt lines 246, 248, and 250 are inactive, and the input signals presented to the synaptic elements on row input lines 224, 226, and 228 cause output signals on column sense lines 238, 240, and 242. During an adapt mode, a vector of input voltages is presented on row input lines 224, 226, and 228 and a selected one of adapt lines 246, 248, and 250 is activated. While the selected adapt line is activated, each of the synaptic elements in that column is adapted to the input voltage present on its row input line as previously described herein.

Figure 9:
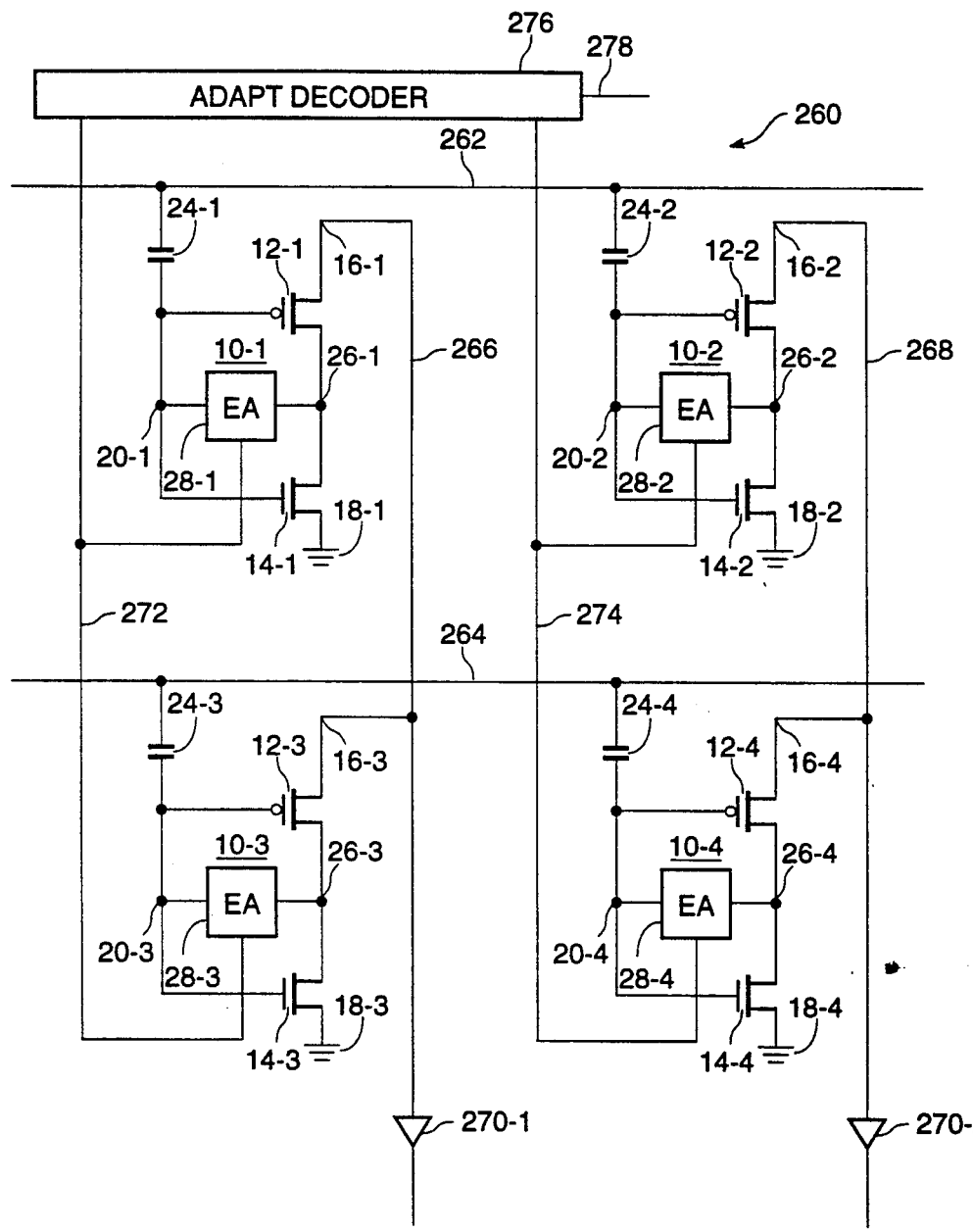
FIG. 9 is a schematic diagram of an illustrative array of electrically-alterable synaptic elements according to the present invention.

Referring now to FIG. 9, an illustrative embodiment of an array 260 of synaptic elements according to the present invention is presented in schematic diagram form. An array of four synaptic elements is shown in FIG. 9, but those of ordinary skill in the art will recognize that the teachings herein allow the fabrication of arbitrarily sized arrays.

The array 260 of FIG. 9 includes two rows and two columns of synaptic elements in the form of the adaptive inverters of FIG. 1a. Thus a first row includes synaptic elements 10-1 and 10-2 and a second row includes synaptic elements 10-3 and 10-4. The first column includes synaptic elements 10-1 and 10-3 and the second column includes synaptic elements 10-2 and 10-4.

The input nodes of the synaptic elements 10-1 and 10-2 in the first row are connected to a first row input line 262. The input nodes of the synaptic elements 10-3 and 10-4 in the second row are connected to a second row input line 264. First and second row input lines 262 and 264 are driven from signals derived elsewhere on the chip or from off chip, possibly through a suitable buffer or other pre-processing circuit as is well known by those of ordinary skill in the art as shown in FIG. 8.

The current sense nodes 16-1 and 16-3 of the synaptic elements in the first column of the array 260 are connected to a first column current sense line 266. The current sense nodes 16-2 and 16-4 of the synaptic elements in the second column of the array 260 are connected to a second column current sense line 268. First and second column sense lines 266 and 268 are each connected to a suitable sense amplifier (shown at reference numerals 270-1 and 270-2) or other post processing circuit as is well known in the art.

The adapt inputs of the synaptic elements in each column of the array are connected to an adapt line associated with that column. Thus, the adapt inputs of synaptic elements 10-1 and 10-3 are connected to adapt line 272. The adapt inputs of synaptic elements 10-2 and 10-4 are connected to adapt line 274. According to a presently preferred embodiment of the invention, adapt lines 272 and 274 may be driven from an adapt decoder 276, which, in the embodiment disclosed in FIG. 9, may be a one-of-two decoder circuit driven from address lines 278 or a serial shift register as is known in the art.

As in the general embodiment of FIG. 8, during normal circuit operation, the adapt lines 272 and 274 are inactive, and the input signals presented to the synaptic elements on row input lines 262 and 264 cause output signals on column sense lines 266 and 268. During an adapt mode, a vector of input voltages is presented on row input lines 262 and 264 and a selected one of adapt lines 272 and 274 is activated. While the selected adapt line is activated, each of the synaptic elements in that column is adapted to the input voltage present on its row input line as previously described herein with reference to the circuit of FIG. 1a.

Figure 10:
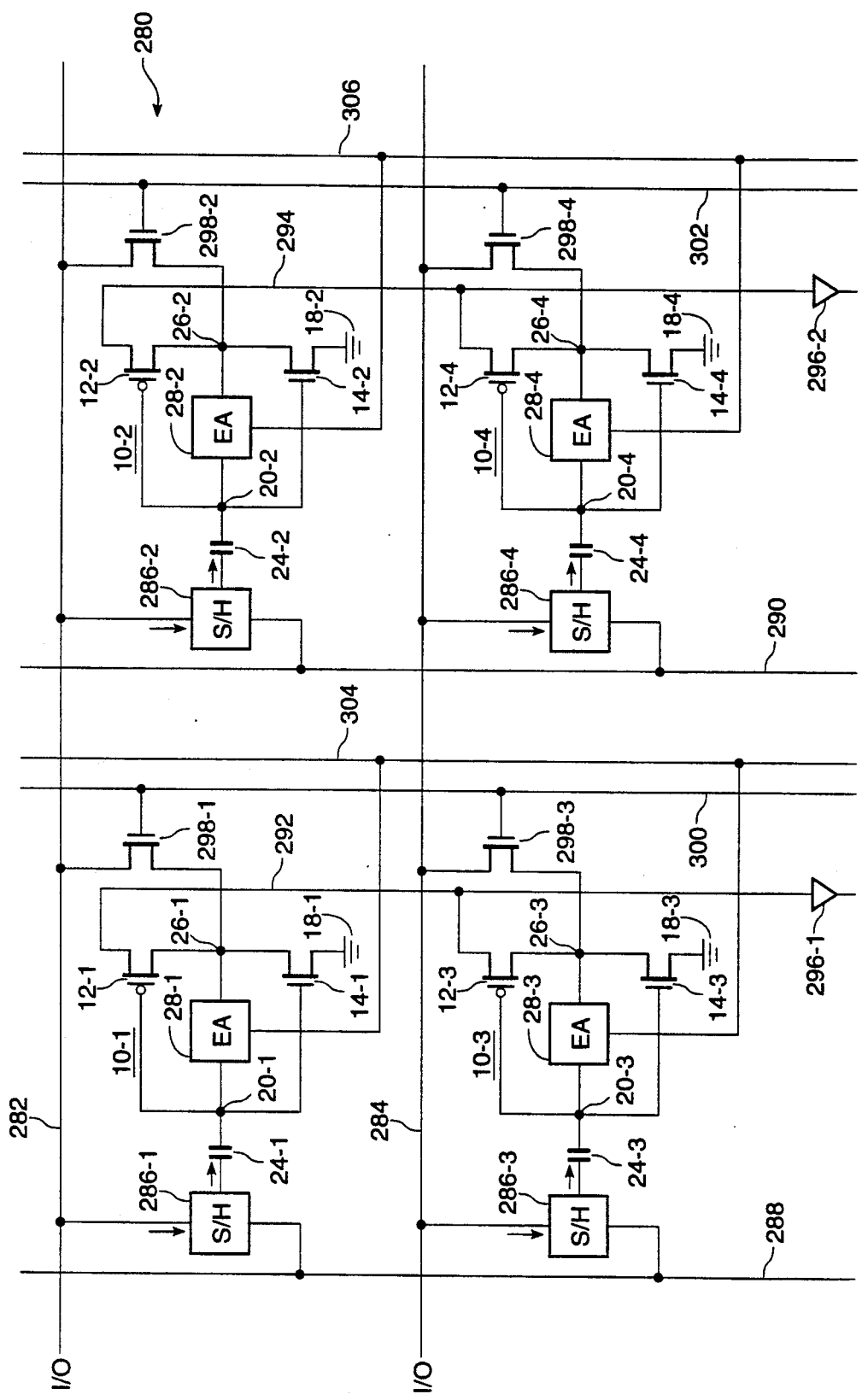
FIG. 10 is a schematic diagram of an illustrative array of readable electrically-alterable synaptic elements according to the present invention.

In some applications, the ability to read the output of the synaptic element is advantageous. Referring now to FIG. 10, an illustrative embodiment of a portion of a readable electrically alterable synaptic array 280 is shown in schematic diagram form. The basic structure of the array is similar to that of the array of FIG. 9. Two rows and two columns comprising synaptic elements 10-1, 10-2, 10-3, and 10-4 are shown.

Row input/output lines 282 and 284 are connected to the signal inputs of sample/hold circuits 286-1 and 286-2, and 286-3 and 286-4 respectively. The outputs of the sample/hold circuits 286-1 through 286-4 are connected to the input nodes of their respective synaptic elements 10-1 through 10-4. The control inputs of sample/hold circuits 286-1 and 286-3 in the first column are connected to first column-sample line 288. The control inputs of sample/hold circuits 286-2 and 286-4 in the second column are connected to second column-sample line 290.

The sense nodes of the synaptic elements 10-1 and 10-3 in the first column are connected to first column sense line 292. The sense nodes of the synaptic elements 10-2 and 10-4 in the second column are connected to second column sense line 294. Column sense line 292 drives column sense amplifier 296-1 and column sense line 294 drives column sense amplifier 296-2.

The output node of each inverter (the node comprising the common drain connections of the P-Channel and N-Channel MOS transistors comprising the inverter) is connected to a read enable transistor. Thus, the source of N-Channel MOS read-enable transistor 298-1 comprises the sense node of the inverter in synaptic element 10-1, and its drain is connected to first row input/output line 282. Similarly, the source of N-Channel MOS read-enable transistor 298-2 is connected to the output node of the inverter in synaptic element 10-2, and its drain is connected to first row input/output line 282, the source of N-Channel MOS read-enable transistor 298-3 is connected to the output node of the inverter in synaptic element 10-3, and its drain is connected to second row input/output line 284, and the source of N-Channel MOS read-enable transistor 298-4 is connected to the output node of the inverter in synaptic element 10-4, and its drain is connected to second row input/output line 284. The gates of N-Channel MOS read-enable transistors 298-1 and 298-3 are connected together to first column read-enable line 300 and the gates of N-Channel MOS read-enable transistors 298-2 and 298-4 are connected together to first column read-enable line 302.

The adapt inputs of synaptic elements 10-1 and 10-3 are connected together to first column adapt line 304 and the adapt inputs of synaptic elements 10-2 and 10-4 are connected together to second column adapt line 306.

During normal operation of the array 280, control lines 288 and 290 are held at a potential which passes the signals on input/output lines 282 and 284 to the input nodes of the synaptic elements, and read enable lines 300 and 302 are held low. When it is desired to read the states of the synaptic elements, a selected vector of voltages are placed on the input/output line and a selected one of the control lines 288 and 290 is placed at a potential which causes the states of the input/output lines to be held in the ones of sample/hold circuits 286-1 through 286-4 in the selected column. The vector of input voltages is then removed from I/O lines 282 and 284, leaving them in a high impedance state. The one of read-enable lines 300 and 302 associated with the selected column is brought high, thus placing the voltages at the output nodes of the synaptic elements in that row on input/output lines 282 and 284. Those of ordinary skill in the art will recognize that the outputs of the circuits driving input voltages on to the input/output lines 282 and 284 may be disabled (i.e., forced to a high impedance state) in response to a signal created by ORing all the write enable signals.

To adapt the synaptic elements in a selected column, the adapt line associated with that column is activated and a vector of voltages to which the synaptic elements are to be adapted is placed on the input/output lines. These voltages may either be latched into the sample/hold circuits or passed through them from the input/output lines.

Figure 11:
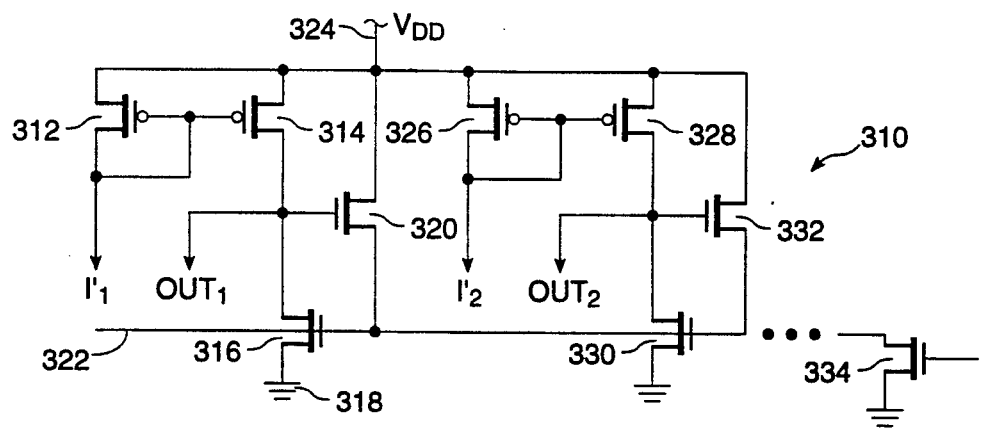
FIG. 11 is a schematic diagram of a generally useful circuit known as a "winner-take-all" circuit.

Referring now to FIG. 11, a circuit known as a "winner-take-all" circuit is shown. This circuit is generally useful and useful in particular as a postprocessing circuit as shown at reference numeral 244 of the array of FIG. 8. The operation of the circuit depicted in FIG. 11 is completely disclosed in U.S. Pat. No. 5,059,814, issued Oct. 22, 1991.

In FIG. 11, winner-take-all circuit 310 includes a plurality of sections, two of which are shown for purposes of illustration. In the first section, a current mirror consists of P-channel MOS current mirror transistor 312 and P-channel MOS current mirror transistor 314. The drain of P-channel MOS current mirror transistor 314 is connected to the drain of N-channel MOS transistor 316. The source of N-channel MOS transistor 316 is connected to a source of negative voltage, shown as reference numeral 318 in FIG. 11 as $V_{SS}$ or ground.

Another N-channel MOS follower transistor 320 has its source connected to a common gate line 322, its drain connected to a source of positive voltage $V_{DD}$, shown at reference numeral 324 and its gate connected to the common connection of the drain of N-channel MOS transistor 316 and the drain of P-channel MOS current mirror transistor 314. The node to which the gate of N-channel MOS transistor 320 is connected is the output current node for the column of the array of FIG. 11 associated with that section shown in FIG. 11 as $OUT_1$.

The second section of the circuit for the second column includes a current mirror comprising P-channel MOS current mirror transistors 326 and 328 and N-channel MOS transistors 330 and 332, connected in exactly the same manner as are the transistors for the first section. Common gate line 322 is connected to the drain of N-channel MOS transistor 334, whose purpose is to provide a bias current out of common gate line 322.

While the operation of the winner-take-all circuit in FIG. 11 is fully described in U.S. Pat. No. 5,059,814 incorporated herein by reference, briefly, follower transistors 320, 332, etc., pull the common gate line 322 up to a voltage at which the saturation current through the common gate pulldown devices 316, 330, etc., is equal to the input current of the winning input. This turns off all sections in the circuit except for the one having the largest current flowing into it.

The circuit of FIG. 11 is very effective in identifying the largest of a number of currents as long as the corresponding transistors in each section are well matched. However, the inevitable mismatches which occur between nominally identical transistors as realized in silicon can cause one section to win even when some other section has higher input current. For this reason, it is desirable to apply the teachings of the present invention to adapt the winner-take-all circuit such that all sections will win equally (tie) when all input currents are equal, and no particular section will be favored due to transistor mismatch.

Figure 12:
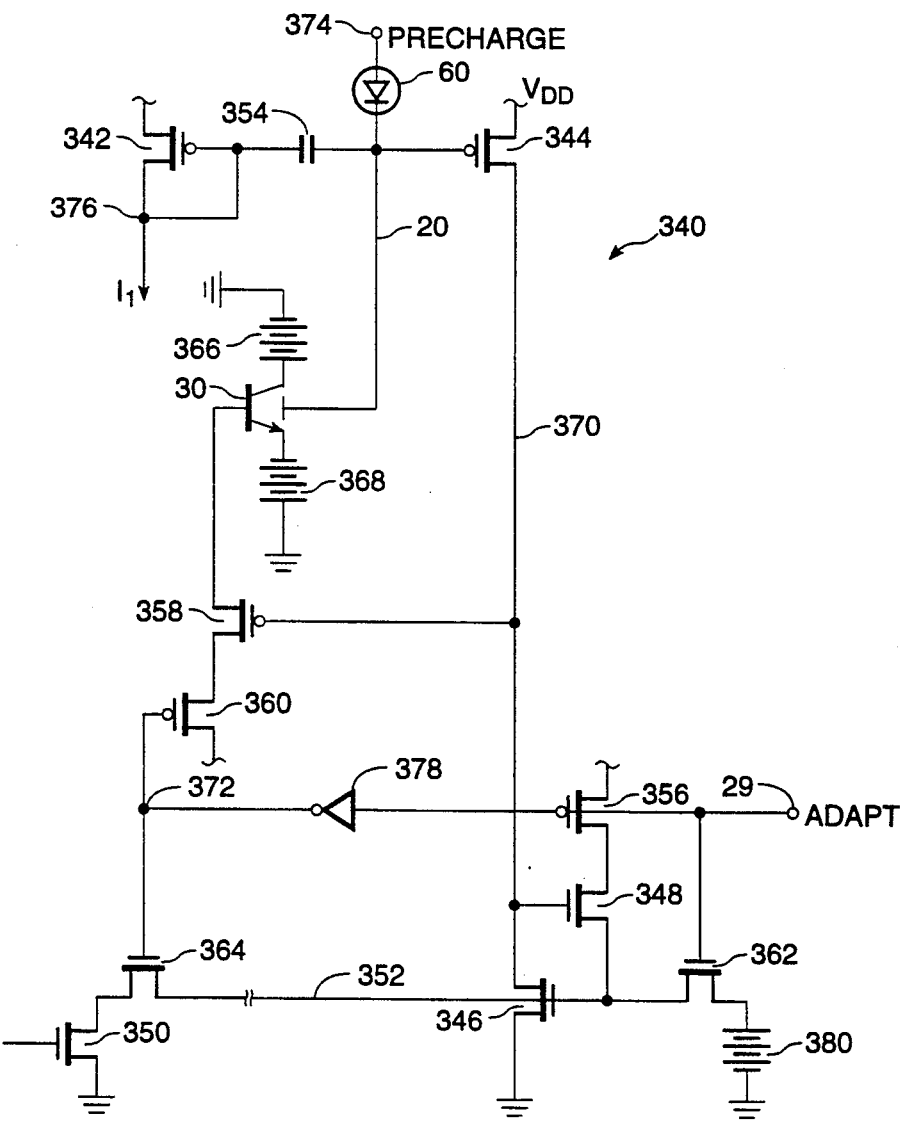
FIG. 12 is a schematic diagram of one section of a winner-take-all circuit of the type shown in FIG. 11, which is electrically adaptive.

One section of an adaptive winner-take-all circuit such as the one shown in FIG. 11 is shown in FIG. 12. In this adaptive winner-take-all circuit 340, P-channel MOS current mirror transistor 342 corresponds to P-channel MOS current mirror transistor 312 in FIG. 11, P-channel MOS current mirror transistor 344 corresponds to P-channel MOS current mirror transistor 314 in FIG. 11, N-channel MOS transistor 346 corresponds to N-channel MOS transistor 316 in FIG. 8, N-channel MOS transistor 348 corresponds to N-channel MOS transistor 320 in FIG. 11, N-channel MOS transistor 350 corresponds to N-channel MOS transistor 334 in FIG. 11, and common gate line 352 corresponds to common gate line 322 in FIG. 11.

In addition, capacitor 354 connects the gate of P-channel MOS current mirror transistor 342 to the gate of P-channel MOS current mirror transistor 344, and P-channel MOS transistor 356, P-channel MOS transistor 358, P-channel MOS transistor 360, N-channel MOS transistor 362, and N-channel MOS transistor 364 are used to reconfigure the circuit during adaptation.

The adaptation portion of the circuit includes hot electron injection device 30, having its gate connected to floating node 20, its collector connected to a source of positive voltage as indicated symbolically by battery symbol 366, and its emitter connected to a source of negative voltage as indicated symbolically by battery 368. In addition, the base of hot electron injection device 30 is connected to the drain of P-channel MOS transistor 358. The source of P-channel MOS transistor 358 is connected to the drain of P-channel MOS transistor 360 and its gate is connected to node 370, the output node of follower P-channel MOS current mirror transistor 344. The source of P-channel MOS transistor 360 is connected to a source of positive voltage $V_{DD}$ and its gate is connected to low active adapt node 372.

Finally, a tunneling device 60 is connected to floating node 20. In order to provide for a global precharge function for all legs of the "winner take all circuit, the ends of the tunneling devices in each leg remote from a floating node 20 are all connected together to a common precharge node 374 connectable to a high voltage source (having a voltage high enough to permit electron tunneling from floating node 20) in order that all floating nodes may be precharged simultaneously by connecting the high voltage source to the precharge node.

The operation of the circuit of FIG. 12 can be understood as follows: when the adapt signal (line 29) is held low, the circuit is configured to be essentially identical to that of FIG. 11. Floating node 20 is coupled to the input node 376 by capacitor 354. When the adapt signal at line 29 is low, the voltage on floating node 20 will follow the voltage on input node 376 quite closely. Hence the operation of the circuit is identical to that described above.

To adapt the circuit, the circuits generating input currents to all stages of the winner-take-all circuit are arranged to be in an equivalent state, that is a state that should be considered to be a tie by the winner-take-all circuit. The adapt signal on line 29 is raised to $V_{DD}$. With adapt signal on line 29 high, the signal on node 372 is held low by the action of inverter 378 and the winner-take-all common gate line 352 is held at a preset voltage noted symbolically by battery 380, by the action of N-channel MOS transistor 362, which is turned on, and P-channel MOS transistor 356, which is turned off. Bias N-channel MOS transistor 350 is disconnected from the winner-take-all common gate line 352 by the action of N-channel MOS transistor 364, which is turned off.

In addition, P-channel MOS transistor 360 is turned on, allowing current to flow into the base of injection device 30. Hot electrons will be injected onto floating gate node 20, causing P-channel MOS current mirror transistor 344 to source more current. This injection will continue until the voltage at node 370 has risen sufficiently to turn off P-channel transistor 358, turning off the injection, i.e. adaptation will continue until floating node 20 is at a voltage to cause the current sourced by P-channel MOS current mirror transistor 344 to equal the current set by N-channel MOS transistor 346 and voltage source 380.

Figure 13:
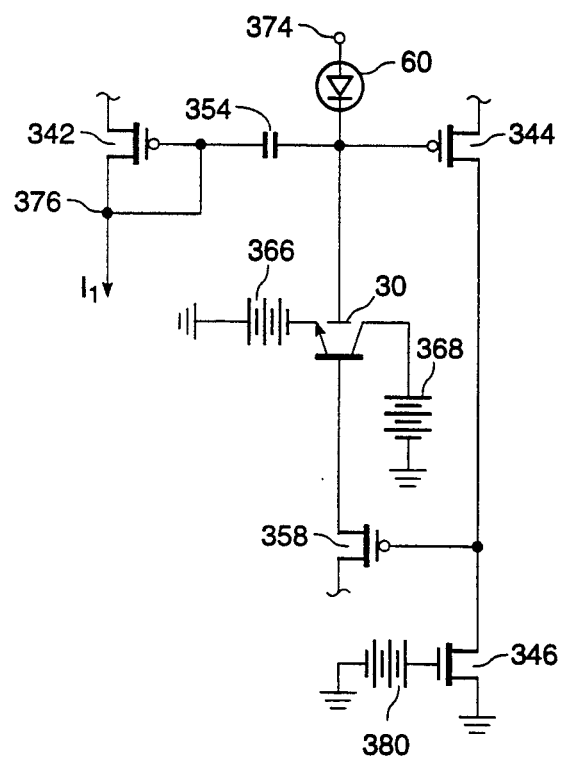
FIG. 13 is an equivalent schematic diagram of the circuit of FIG. 12 during adaptation.

During adaptation, those of ordinary skill in the art will appreciate that the circuit of FIG. 13 is the equivalent circuit of the circuit shown in FIG. 12. Those of ordinary skill in the art will appreciate the circuit of FIG. 13 to be an inverting amplifier with capacitor 354 in series with its inverting input, in accord with the teachings of the present invention. It follows that all outputs will be adapted to very nearly the same voltage. After the adaptation is complete, the adapt control signal 29 is brought low. Thereafter the circuit will function as the circuit of FIG. 11, in which the effects of all offsets, including those of the circuits generating the input currents, are compensated.

It will be appreciated by those of ordinary skill in the art that the adaptation of the winner-take-all circuit is a special case of a generally useful method, which can be appreciated with reference to FIG. 13. During adaptation, the gate of N-channel MOS transistor 346 is connected to a source of bias voltage, and the function of N-channel MOS transistor 346 is to supply the output current desired from the current mirror when the particular "calibration" input current is present. If the current mirror transistors are operated in their sub-threshold range, where their drain currents are an exponential function of their gate voltages, the effect of adaptation is to fix the ratio of output current to input current at a particular desired value. After adaptation, the source of desired current can be removed and the current mirror can be used for any desired purpose, of which the winner-take-all function for postprocessing circuit 244 of the array of FIG. 8 is one particularly useful example.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A synaptic array fabricated on a semiconductor substrate comprising:

a plurality of electrically-alterable synaptic elements disposed in at least one row and at least one column, each of said electrically-alterable synaptic elements comprising an input node, an output node, an amplifier having an input connected to a floating node and an output connected to said output node, a MOS capacitor having a first plate connected to said input node and a second plate connected to said floating node, an adapt control signal node, an electron injecting means coupled to said floating node for injecting electrons on to said floating node while the voltage on said floating node is within the normal operating range of said amplifier, negative feedback means, coupled between said floating node and said electron injecting means, and responsive to an adapt control signal asserted on said adapt control signal node for controlling said electron injecting means to vary the rate of injection of electrons on to said floating node in response to the magnitude of the voltage on said floating node, and a current sense node for supplying a current required by said synaptic element in response to a signal on said input node and said voltage on said floating node;

a row input line associated with each row of said array, each said row input line connected to the input nodes of all of said electrically alterable synaptic elements associated with its row;

at least one column sense line associated with each column of said array, each column sense line connected to the current sense nodes of all of said electrically alterable synaptic elements associated with its column;

a column adapt control input line associated with each column of said array, each said column adapt control input line connected to the adapt control signal nodes of all of said electrically alterable synaptic elements associated with its column, and an electrically adaptable winner-take-all circuit having a plurality of corresponding inputs and outputs and an adapt input, a different one of said corresponding inputs connected to each one of said column sense lines.

2. The synaptic array of claim 1 wherein said electron injecting means is a semiconductor structure for performing hot electron injection.

3. The synaptic array of claim 2 wherein each of said electron injecting means is a non-avalanche hot electron injection device including:

a p-type region in said semiconductor substrate;
an n-type region disposed in said p-type region;
a floating gate disposed above said p-type region, said floating gate at least partially overlapping one edge of said n-type region and separated from the surface of said substrate by a gate oxide under a portion of said floating gate including at least where it partially overlaps the edge of said n-type region;

means for applying a first positive potential to said n-type region with respect to said p-type region to reverse bias said n-type region, said positive potential having a magnitude greater than about 2 volts relative to said p-type region, but less than the voltage required to induce avalanche breakdown between said n-type region and said p-type region;

means for capacitively coupling a second positive potential to said floating gate, said second positive potential having a magnitude of greater than about 2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

4. A synaptic array fabricated on a semiconductor substrate comprising:

a plurality of electrically-alterable synaptic elements disposed in at least one row and at least two columns, each of said electrically-alterable synaptic elements comprising an input node, an output node, an amplifier having an input connected to a floating node and an output connected to said output node, an MOS capacitor having a first plate connected to said input node and a second plate connected to said floating node, an adapt control signal node, an electron removal means coupled to said floating node for removing electrons from said floating node while the voltage on said floating node is within the normal operating range of said amplifier, negative feedback means, coupled between said floating node and said electron removal means, and responsive to an adapt control signal asserted on said adapt control signal node for controlling said electron removal means to vary the rate of removal of electrons from said floating node in response to the magnitude of the voltage on said floating node, and a current sense node for supplying a current required by said synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column;

a column adapt control input line associated with each column of said array, each said column adapt control input line connected to the adapt control signal nodes of all of said electrically alterable synaptic elements associated with its column; and an electrically adaptable winner-take-all circuit having a plurality of corresponding inputs and outputs and an adapt input, a different one of said corresponding inputs connected to each one of said column sense lines.

5. The synaptic array of claim 4 wherein said electron removal means is a conductor-insulator-conductor structure for performing electron tunneling.

6. The synaptic array of claim 5 wherein said floating node is a layer of polysilicon and said electron removal means includes a second layer of polysilicon separated from said floating node by a layer of $SiO_2$.

7. A synaptic array fabricated on a semiconductor substrate comprising:

a plurality of electrically-alterable synaptic elements disposed in at least one row and at least one column, each of said electrically-alterable synaptic elements comprising an input node, an output node, an amplifier having an input connected to a floating node and an output connected to said output node, an MOS capacitor having a first plate connected to said input node and a second plate connected to said floating node, an adapt control signal node, an electron injecting means coupled to said floating node for injecting electrons on to said floating node while the voltage on said floating node is within the normal operating range of said amplifier, electron removal means coupled to said floating node for removing electrons from said floating node while the voltage on said floating node is within the normal operating range of said amplifier, first negative feedback means coupled between said floating node and said electron injecting means, and responsive to an adapt control signal asserted on said adapt control signal node for controlling said electron injecting means to vary the rate of injection of electrons on to said floating node in response to the magnitude of the voltage on said floating node, second negative feedback means, coupled between said floating node and said electron removal means, and responsive to an adapt control signal asserted on said adapt control signal node for controlling said electron removal means to vary the rate of removal of electrons from said floating node in response to the magnitude of the voltage on said floating node, and a current sense node for supplying a current required by said Synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column;

a column adapt control input line associated with each column of said array, each said column adapt control input line connected to the adapt control signal nodes of all of said electrically alterable synaptic elements associated with its column; and an electrically adaptable winner-take-all circuit having a plurality of corresponding inputs and outputs and an adapt input, a different one of said corresponding inputs connected to each one of said column sense lines.

8. The synaptic array of claim 7 wherein said electron injecting means is a conductor-insulator-conductor structure for performing hot electron injection.

9. The synaptic array of claim 8 wherein each of said electron injecting means is a semiconductor structure for performing non-avalanche hot electron injection including:

a p-type region in said semiconductor substrate;
an n-type region disposed in said p-type region;
a floating gate disposed above said p-type region, said floating gate at least partially overlapping one edge of said n-type region and separated from the surface of said substrate by a gate oxide under a portion of said floating gate including at least where it partially overlaps the edge of said n-type region;

means for applying a first positive potential to said n-type region with respect to said p-type region to reverse bias said n-type region, said positive potential having a magnitude greater than about 2 volts relative to said p-type region, but less than the voltage required to induce avalanche breakdown between said n-type region and said p-type region;

means for capacitively coupling a second positive potential to said floating gate, said second positive potential having a magnitude of greater than about 2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

10. The synaptic array of claim 7 wherein said electron removal means is a conductor-insulator-conductor structure for performing electron tunneling.

11. The synaptic array of claim 10 wherein said floating node is a layer of polysilicon and said electron removal means includes a second layer of polysilicon separated from said floating node by a layer of $SiO_2$.

12. A synaptic array fabricated on a semiconductor substrate comprising:

a plurality of electrically-alterable synaptic elements disposed in at least one row and at least two columns, each of said electrically-alterable synaptic elements comprising an input node, an output node, an inverter including a P-Channel MOS transistor having a drain, a source connected to said current sense node, and a gate connected to a floating node,and an N-Channel MOS transistor having a drain connected to the drain of said P-Channel MOS transistor and to said output node, a gate connected to said floating node, and a source connected to a source of a fixed voltage potential, a MOS capacitor connected between said input node and said floating node, an adapt control signal node, an electron injecting means coupled to said floating node for injecting electrons on to said floating node while the voltage on said floating node is within the normal operating range of said inverter, injector control means, responsive to said adapt signal and the voltage on said output node, for generating an electrical injection control signal to control said electron injecting means to increase the rate of injection of electrons on to said floating node in response to an increase in voltage on said floating node and to decrease the rate of injection of electrons on to said floating node in response to an decrease in voltage on said floating node, and a current sense node for supplying a current required by said synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column;

a column adapt control input line associated with each column of said array, each said column adapt control input line connected to the adapt control signal nodes of all of said electrically alterable synaptic elements associated with its column; and an electrically adaptable winner-take-all circuit having a plurality of corresponding inputs and outputs and an adapt input, a different one of said corresponding inputs connected to each one of said column sense lines.

13. The synaptic array of claim 12 wherein said electron injecting means is a conductor-insulator-conductor structure for performing hot electron injection.

14. The synaptic array of claim 13 wherein said electron injecting means is a non-avalanche hot electron injection device including:

a p-type region in said semiconductor substrate;

an n-type region disposed in said p-type region;

a floating gate disposed above said p-type region, said floating gate at least partially overlapping one edge of said n-type region and separated from the surface of said substrate by a gate oxide under a portion of said floating gate including at least where it partially overlaps the edge of said n-type region;

means for applying a first positive potential to said n-type region with respect to said p-type region to reverse bias said n-type region, said positive potential having a magnitude greater than about 2 volts relative to said p-type region, but less than the voltage required to induce avalanche breakdown between said n-type region and said p-type region;

means for capacitively coupling a second positive potential to said floating gate, said second positive potential having a magnitude of greater than about 2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

15. A synaptic array fabricated on a semiconductor substrate comprising:

a plurality of electrically-alterable synaptic elements disposed in at least one row and at least one column, each of said electrically-alterable synaptic elements comprising an input node, an output node, an inverter including a P-Channel MOS transistor having a drain, a source connected to said current sense node, and a gate connected to a floating node, and an N-Channel MOS transistor having a drain connected to the drain of said P-Channel MOS transistor and to said output node, a gate connected to said floating node, and a source connected to a source of a fixed voltage potential, a MOS capacitor connected between said input node and said floating node, an adapt control signal node, an electron removal means coupled to said floating node for removing electrons from said floating node while the voltage on said floating node is within the normal operating range of said inverter, removal control means, responsive to said adapt signal and the voltage on said output node, for generating an electrical removal control signal to control said electron removal means to decrease the rate of removal of electrons on to said floating node in response to an increase in voltage on said floating node and to increase the rate of removal of electrons on to said floating node in response to an decrease in voltage on said floating node, and a current sense node for supplying a current required by said synaptic element in response to a Signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column;

a column adapt control input line associated with each column of said array, each said column adapt control input line connected to the adapt control signal nodes of all of said electrically alterable synaptic elements associated with its column; and an electrically adaptable winner-take-all circuit having a plurality of corresponding inputs and outputs and an adapt input, a different one of said corresponding inputs connected to each one of said column sense lines.

16. The synaptic array of claim 15 wherein said electron removal means is a conductor-insulator-conductor structure for performing electron tunneling.

17. The synaptic array of claim 16 wherein said floating node is a layer of polysilicon and said electron removal means includes a second layer of polysilicon separated from said floating node by a layer of $SiO_2$.

18. A synaptic array fabricated on a semiconductor substrate comprising:

a plurality of electrically-alterable synaptic elements disposed in at least one row and at least two columns, each of said electrically-alterable synaptic elements comprising an input node, an output node, an inverter including a P-Channel MOS transistor having a drain, a source connected to said current sense node, and a gate connected to a floating node, and an N-Channel MOS transistor having a drain connected to the drain of said P-Channel MOS transistor and to said output node, a gate connected to said floating node, and a source connected to a source of a fixed voltage potential, a MOS capacitor connected between said input node and said floating node, an adapt control signal node, an electron injecting means coupled to said floating node for injecting electrons on to said floating node while the voltage on said floating node is within the normal operating range of said inverter, electron removal means coupled to said floating node for removing electrons from said floating node while the voltage on said floating node is within the normal operating range of said inverter, injector control means, responsive to said adapt signal and the voltage on said output node, for generating an electrical injection control signal to control said electron injecting means to increase the rate of injection of electrons on to said floating node in response to an increase in voltage on said floating node and to decrease the rate of injection of electrons on to said floating node in response to an decrease in voltage on said floating node, removal control means, responsive to said adapt signal and the voltage on said output node, for generating an electrical removal control signal to control said electron removal means to decrease the rate of removal of electrons on to said floating node in response to an increase in voltage on said floating node and to increase the rate of removal of electrons on to said floating node in response to an decrease in voltage on said floating node, and a current sense node for Supplying a current required by said synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column;

a column adapt control input line associated with each column of said array, each said column adapt control input line connected to the adapt control signal nodes of all of said electrically alterable synaptic elements associated with its column; and an electrically adaptable winner-take-all circuit having a plurality of corresponding inputs and outputs and an adapt input, a different one of said corresponding inputs connected to each one of said column sense lines.

19. The synaptic array of claim 18 wherein said electron injecting means is a conductor-insulator-conductor structure for performing hot electron injection.

20. The synaptic array of claim 19 wherein said electron injecting means is a non-avalanche hot electron injection device including:
a p-type region in said semiconductor substrate;
an n-type region disposed in said p-type region;
a floating gate disposed above said p-type region, said floating gate at least partially overlapping one edge of said n-type region and separated from the surface of said substrate by a gate oxide under a portion of said floating gate including at least where it partially overlaps the edge of said n-type region;
means for applying a first positive potential to said n-type region with respect to said p-type region to reverse bias said n-type region, said positive potential having a magnitude greater than about 2 volts relative to said p-type region, but less than the voltage required to induce avalanche breakdown between said n-type region and said p-type region;
means for capacitively coupling a second positive potential to said floating gate, said second positive potential having a magnitude of greater than about 2 volts relative to said p-type region;
means for injecting electrons into said p-type region; whereby said first and second positive potentials act to accelerate said electrons to an energy sufficient to surmount the barrier energy of said gate oxide and thereby inject said electrons onto said floating gate.

21. The synaptic array of claim 17 wherein said electron removal means is a conductor-insulator-conductor structure for performing electron tunneling.

22. The synaptic array of claim 21 wherein said floating node is a layer of polysilicon and said electron removal means includes a second layer of polysilicon separated from said floating node by a layer of $SiO_2$.

23. A synaptic array fabricated on a semiconductor substrate comprising:
a plurality of electrically-alterable synaptic elements disposed in at least one row and at least one column, each of said electrically-alterable synaptic elements comprising an input node, an output node, an amplifier having an input connected to a floating node and an output connected to said output node, an MOS capacitor having a first plate connected to said input node and a second plate connected to said floating node, an adapt control signal node, an electron injecting means coupled to said floating node for injecting electrons on to said floating node while the voltage on said floating node is within the normal operating range of said amplifier, negative feedback means, coupled between said floating node and said electron injecting means, and responsive to an adapt control signal asserted on said adapt control signal node for controlling said electron injecting means to vary the rate of injection of electrons on to said floating node in response to the magnitude of the voltage on said floating node, and a current sense node for supplying a current required by said synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column; and a column adapt control input line associated with each column of said array, each said column adapt control input line connected to the adapt control signal nodes of all of said electrically alterable synaptic elements associated with its column.

24. The synaptic array of claim 23 wherein said electron injecting means is a semiconductor structure for performing hot electron injection.

25. The synaptic array of claim 24 wherein each of said electron injecting means is a non-avalanche hot electron injection device including:
a p-type region in said semiconductor substrate;
an n-type region disposed in said p-type region;
a floating gate disposed above said p-type region, said floating gate at least partially overlapping one edge of said n-type region and separated from the surface of said substrate by a gate oxide under a portion of said floating gate including at least where it partially overlaps the edge of said n-type region;
means for applying a first positive potential to said n-type region with respect to said p-type region to reverse bias said n-type region, said positive potential having a magnitude greater than about 3.2 volts relative to said p-type region, but less than the voltage required to induce avalanche breakdown between said n-type region and said p-type region;
means for capacitively coupling a second positive potential to said floating gate, said second positive potential having a magnitude of greater than about 3.2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

26. A synaptic array fabricated on a semiconductor substrate comprising:

a plurality of electrically-alterable synaptic elements disposed in at least one row and at least one column, each of said electrically-alterable synaptic elements comprising an input node, an output node, an amplifier having an input connected to a floating node and an output connected to said output node, an MOS capacitor having a first plate connected to said input node and a second plate connected to said floating node, an adapt control signal node, an electron removal means coupled to said floating node for removing electrons from said floating node while the voltage on said floating node is within the normal operating range of said amplifier, negative feedback means, coupled between said floating node and said electron removal means, and responsive to an adapt control signal asserted on said adapt control signal node for controlling said electron removal means to vary the rate of removal of electrons from said floating node in response to the magnitude of the voltage on said floating node, and a current sense node for supplying a current required by said synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column; and a column adapt control input line associated with each column of said array, each said column adapt control input line connected to the adapt control signal nodes of all of said electrically alterable synaptic elements associated with its column.

27. The synaptic array of claim 26 wherein said electron removal means is a semiconductor structure for performing electron tunneling.

28. The synaptic array of claim 27 wherein said floating node is a layer of polysilicon and said electron removal means includes a second layer of polysilicon separated from said floating node by a layer of $SiO_2$.

29. A synaptic array fabricated on a semiconductor substrate comprising:

a plurality of electrically-alterable synaptic elements disposed in at least one row and at least one column, each of said electrically-alterable synaptic elements comprising an input node, an output node, an amplifier having an input connected to a floating node and an output connected to said output node, an MOS capacitor having a first plate connected to said input node and a second plate connected to said floating node, an adapt control signal node, an electron injecting means coupled to said floating node for injecting electrons on to said floating node while the voltage on said floating node is within the normal operating range of said amplifier, an electron removal means coupled to said floating node for removing electrons from said floating node while the voltage on said floating node is within the normal operating range of said amplifier, first negative feedback means coupled between said floating node and said electron injecting means, and responsive to an adapt control signal asserted on said adapt control signal node for controlling said electron injecting means to vary the rate of injection of electrons on to said floating node in response to the magnitude of the voltage on said floating node, second negative feedback means, coupled between said floating node and said electron removal means, and responsive to an adapt control signal asserted on said adapt control signal node for controlling said electron removal means to vary the rate of removal of electrons from said floating node in response to the magnitude of the voltage on said floating node, and a current sense node for supplying a current required by said synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column; and a column adapt control input line associated with each column of said array, each said column adapt control input line connected to the adapt control signal nodes of all of said electrically alterable synaptic elements associated with its column.

30. The synaptic array of claim 29 wherein said electron injecting means is a semiconductor structure for performing hot electron injection.

31. The synaptic array of claim 30 wherein each of said electron injecting means is a semiconductor structure for performing non-avalanche hot electron injection including:

a p-type region in said semiconductor substrate;

an n-type region disposed in said p-type region;

a floating gate disposed above said p-type region, said floating gate at least partially overlapping one edge of said n-type region and separated from the surface of said substrate by a gate oxide under a portion of said floating gate including at least where it partially overlaps the edge of said n-type region;

means for applying a first positive potential to said n-type region with respect to said p-type region to reverse bias said n-type region, said positive potential having a magnitude greater than about 3.2 volts relative to said p-type region, but less than the voltage required to induce avalanche breakdown between said n-type region and said p-type region;

means for capacitively coupling a second positive potential to said floating gate, said second positive potential having a magnitude of greater than about 3.2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

32. The synaptic array of claim 31 wherein said electron removal means is a semiconductor structure for performing electron tunneling.

33. The synaptic array of claim 32 wherein said floating node is a layer of polysilicon and said electron removal means includes a second layer of polysilicon separated from said floating node by a layer of $SiO_2$.

34. A synaptic array fabricated on a semiconductor substrate comprising:
a plurality of electrically-alterable synaptic elements disposed in at least one row and at least one column, each of said electrically-alterable synaptic elements comprising an input node, an output node, an inverter including a P-Channel MOS transistor having a drain, a source connected to said current sense node, and a gate connected to a floating node, and an N-Channel MOS transistor having a drain connected to the drain of said P-Channel MOS transistor and to said output node, a gate connected to said floating node, and a source connected to a source of a fixed voltage potential, a MOS capacitor connected between said input node and said floating node, an adapt control signal node, an electron injecting means coupled to said floating node for injecting electrons on to said floating node while the voltage on said floating node is within the normal operating range of said amplifier, injector control means, responsive to said adapt signal and the voltage on said output node, for generating an electrical injection control signal to control said electron injecting means to increase the rate of injection of electrons on to said floating node in response to an increase in voltage on said floating node and to decrease the rate of injection of electrons on to said floating node in response to an decrease in voltage on said floating node, and a current sense node for supplying a current required by said synaptic element in response to a signal on said input node and said voltage on said floating node;
a row input line associated with each row of said array, each said row input line connected to the input nodes of all of said electrically alterable synaptic elements associated with its row;
a column sense line associated with each column of said array, each said column sense line connected to the current sense nodes of all of said electrically alterable synaptic elements associated with its column; and
a column adapt control input line associated with each column of said array, each said column adapt control input line connected to the adapt control signal nodes of all of said electrically alterable synaptic elements associated with its column.

35. The synaptic array of claim 34 wherein said electron injecting means is a semiconductor structure for performing hot electron injection.

36. The synaptic array of claim 35 wherein said electron injecting means is a non-avalanche hot electron injection device including:
a p-type region in said semiconductor substrate;
an n-type region disposed in said p-type region;
a floating gate disposed above said p-type region, said floating gate at least partially overlapping one edge of said n-type region and separated from the surface of said substrate by a gate oxide under a portion of said floating gate including at least where it partially overlaps the edge of said n-type region;
means for applying a first positive potential to said n-type region with respect to said p-type region to reverse bias said n-type region, said positive potential having a magnitude greater than about 3.2 volts relative to said p-type region, but less than the voltage required to induce avalanche breakdown between said n-type region and said p-type region;
means for capacitively coupling a second positive potential to said floating gate, said second positive potential having a magnitude of greater than about 3.2 volts relative to said p-type region;
means for injecting electrons into said p-type region;
whereby said first and second positive potentials act to accelerate said electrons to an energy sufficient to surmount the barrier energy of said gate oxide and thereby inject said electrons onto said floating gate.

37. A synaptic array fabricated on a semiconductor substrate comprising:
a plurality of electrically-alterable synaptic elements disposed in at least one row and at least one column, each of said electrically-alterable synaptic elements comprising an input node, an output node, an inverter including a P-Channel MOS transistor having a drain, a source connected to said current sense node, and a gate connected to a floating node, and an N-Channel MOS transistor having a drain connected to the drain of said P-Channel MOS transistor and to said output node, a gate connected to said floating node, and a source connected to a source of a fixed voltage potential, a MOS capacitor connected between said input node and said floating node, an adapt control signal node, electron removal means coupled to said floating node for removing electrons from said floating node while the voltage on said floating node is within the normal operating range of said amplifier, removal control means, responsive to said adapt signal and the voltage on said output node, for generating an electrical removal control signal to control said electron removal means to decrease the rate of removal of electrons on to said floating node in response to an increase in voltage on said floating node and to increase the rate of removal of electrons on to said floating node in response to an decrease in voltage on said floating node, and a current sense node for supplying a current required by said synaptic element in response to a signal on said input node and said voltage on said floating node;
a row input line associated with each row of said array, each said row input line connected to the input nodes of all of said electrically alterable synaptic elements associated with its row;
a column sense line associated with each column of said array, each said column sense line connected to the current sense nodes of all of said electrically alterable synaptic elements associated with its column; and
a column adapt control input line associated with each column of said array, each said column adapt control input line connected to the adapt control signal nodes of all of said electrically alterable synaptic elements associated with its column.

38. The synaptic array of claim 37 wherein said electron removal means is a semiconductor structure for performing electron tunneling.

39. The synaptic array of claim 38 wherein said floating node is a layer of polysilicon and said electron removal means includes a second layer of polysilicon separated from said floating node by a layer of $SiO_2$.

40. A synaptic array fabricated on a semiconductor substrate comprising:

a plurality of electrically-alterable synaptic elements disposed in at least one row and at least one column, each of said electrically-alterable synaptic elements comprising an input node, an output node, an inverter including a P-Channel MOS transistor having a drain, a source connected to said current sense node, and a gate connected to a floating node, and an N-Channel MOS transistor having a drain connected to the drain of said P-Channel MOS transistor and to said output node, a gate connected to said floating node, and a source connected to a source of a fixed voltage potential, a MOS capacitor connected between said input node and said floating node, an adapt control signal node, an electron injecting means coupled to said floating node for injecting electrons on to said floating node while the voltage on said floating node is within the normal operating range of said amplifier, an electron removal means coupled to said floating node for removing electrons from said floating node while the voltage on said floating node is within the normal operating range of said amplifier, injector control means, responsive to said adapt signal and the voltage on said output node, for generating an electrical injection control signal to control said electron injecting means to increase the rate of injection of electrons on to said floating node in response to an increase in voltage on said floating node and to decrease the rate of injection of electrons on to said floating node in response to an decrease in voltage on said floating node, removal control means, responsive to said adapt signal and the voltage on said output node, for generating an electrical removal control signal to control said electron removal means to decrease the rate of removal of electrons on to said floating node in response to an increase in voltage on said floating node and to increase the rate of removal of electrons on to said floating node in response to an decrease in voltage on said floating node, and a current sense node for supplying a current required by said synaptic element in response to a signal on said input node and said voltage on said floating node;

a row input line associated with each row of said array, each said row input line connected to the input nodes of all of said electrically alterable synaptic elements associated with its row;

a column sense line associated with each column of said array, each said column sense line connected to the current sense nodes of all of said electrically alterable synaptic elements associated with its column; and a column adapt control input line associated with each column of said array, each said column adapt control input line connected to the adapt control signal nodes of all of said electrically alterable synaptic elements associated with its column.

41. The synaptic array of claim 40 wherein said electron injecting means is a semiconductor structure for performing hot electron injection.

42. The synaptic array of claim 41 wherein said electron injecting means is a non-avalanche hot electron injection device including:

a p-type region in said semiconductor substrate;

an n-type region disposed in said p-type region;

a floating gate disposed above said p-type region, said floating gate at least partially overlapping one edge of said n-type region and separated from the surface of said substrate by a gate oxide under a portion of said floating gate including at least where it partially overlaps the edge of said n-type region;

means for applying a first positive potential to said n-type region with respect to said p-type region to reverse bias said n-type region, said positive potential having a magnitude greater than about 3.2 volts relative to said p-type region, but less than the voltage required to induce avalanche breakdown between said n-type region and said p-type region;

means for capacitively coupling a second positive potential to said floating gate, said second positive potential having a magnitude of greater than about 3.2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

43. The synaptic array of claim 39 wherein said electron removal means is a semiconductor structure for performing electron tunneling.

44. The synaptic array of claim 43 wherein said floating node is a layer of polysilicon and said electron removal means includes a second layer of polysilicon separated from said floating node by a layer of $SiO_2$.

* * * * *